United States Patent
Cho et al.

(10) Patent No.: US 8,438,459 B2
(45) Date of Patent: May 7, 2013

(54) APPARATUS AND METHOD FOR DECODING USING CHANNEL CODE

(75) Inventors: Ki Hyoung Cho, Gyeonggi-do (KR); Min Seok Oh, Seoul (KR); Kyu Hyuk Chung, Seoul (KR); Young Seob Lee, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 1119 days.

(21) Appl. No.: 11/722,345

(22) PCT Filed: Dec. 22, 2005

(86) PCT No.: PCT/KR2005/004466
§ 371 (c)(1),
(2), (4) Date: Dec. 4, 2007

(87) PCT Pub. No.: WO2006/068435
PCT Pub. Date: Jun. 29, 2006

(65) Prior Publication Data
US 2008/0077843 A1    Mar. 27, 2008

(30) Foreign Application Priority Data

Dec. 22, 2004  (KR) .................. 10-2004-0110678
Jan. 13, 2005  (KR) .................. 10-2005-0003296
Oct. 27, 2005  (KR) .................. 10-2005-0101898

(51) Int. Cl.
    *H03M 13/00* (2006.01)
(52) U.S. Cl.
    USPC .................................. 714/781; 714/758
(58) Field of Classification Search ............ 714/758, 714/781
    See application file for complete search history.

(56) References Cited

U.S. PATENT DOCUMENTS

| | | | |
|---|---|---|---|
| 6,567,465 B2 | 5/2003 | Goldstein et al. | |
| 6,633,856 B2* | 10/2003 | Richardson et al. | 706/15 |
| 6,718,508 B2* | 4/2004 | Lodge et al. | 714/780 |
| 6,757,122 B1* | 6/2004 | Kuznetsov et al. | 360/53 |
| 6,829,308 B2* | 12/2004 | Eroz et al. | 375/271 |
| 6,957,375 B2* | 10/2005 | Richardson | 714/752 |

(Continued)

FOREIGN PATENT DOCUMENTS

| | | |
|---|---|---|
| CN | 1499731 | 5/2004 |
| EP | 1622276 | 2/2006 |

(Continued)

OTHER PUBLICATIONS

F. Guilloud, "Architecture generique de decodeur de codes LDPC," These presentee pour obtenir le grade de docteur de l'Ecole nationale superieure des telecommunications, Jul. 2004, XP-002370625.

(Continued)

*Primary Examiner* — Joseph D Torres
(74) *Attorney, Agent, or Firm* — Lee, Hong, Degerman, Kang & Waimey

(57) ABSTRACT

An encoding and decoding method and apparatus. is disclosed. The method and apparatus improves encoding and decoding performance without using a large memory capacity and also reduces the complexity of hardware for implementation. According to the method, an encoded signal is received from a transmitting side, and the received signal is decoded using the parity check matrix. The parity check matrix includes layers where nonzero elements of a specific number or layers do not overlap in column direction.

14 Claims, 41 Drawing Sheets

U.S. PATENT DOCUMENTS

| | | | |
|---|---|---|---|
| 6,961,888 B2 * | 11/2005 | Jin et al. | 714/752 |
| 7,120,856 B2 * | 10/2006 | Zhang et al. | 714/801 |
| 7,133,853 B2 * | 11/2006 | Richardson et al. | 706/15 |
| 7,143,333 B2 * | 11/2006 | Blankenship et al. | 714/781 |
| 7,162,684 B2 * | 1/2007 | Hocevar | 714/800 |
| 7,178,082 B2 * | 2/2007 | Yu et al. | 714/752 |
| 7,188,281 B2 | 3/2007 | Kim et al. | |
| 7,188,297 B2 * | 3/2007 | Blankenship et al. | 714/758 |
| 7,260,763 B2 * | 8/2007 | Sukhobok et al. | 714/758 |
| 7,302,629 B2 * | 11/2007 | Kyung et al. | 714/752 |
| 7,313,752 B2 * | 12/2007 | Kyung et al. | 714/801 |
| 7,343,548 B2 * | 3/2008 | Blankenship et al. | 714/800 |
| 7,373,581 B2 | 5/2008 | Okamura et al. | |
| 7,415,659 B2 * | 8/2008 | Banister et al. | 714/780 |
| 7,581,157 B2 * | 8/2009 | Oh et al. | 714/781 |
| 2003/0033570 A1 | 2/2003 | Khannanov et al. | |
| 2004/0034828 A1 | 2/2004 | Hocevar | |
| 2004/0057575 A1 | 3/2004 | Zhang et al. | |
| 2004/0148560 A1 | 7/2004 | Hocevar | |
| 2004/0194007 A1 | 9/2004 | Hocevar | |
| 2008/0077843 A1 * | 3/2008 | Cho et al. | 714/801 |

FOREIGN PATENT DOCUMENTS

| | | | |
|---|---|---|---|
| JP | 2003115768 | | 4/2003 |
| JP | 2007503755 | | 2/2007 |
| WO | 2004006442 | A1 | 1/2004 |
| WO | 2004/019268 | | 3/2004 |
| WO | 2004047019 | A2 | 6/2004 |
| WO | 2004107585 | | 12/2004 |
| WO | 2006068435 | | 6/2006 |

OTHER PUBLICATIONS

E. Shasha et al., "Multi-Rate LDPC code for OFDMA PHY," IEEE 802.16 Broadband Wireless Access Working Group, IEEE C802.16e-04/185, Jun. 2004, XP-002334837.

R.G. Gallager, "Low-density parity-check codes," IRE Transactions on Information Theory, vol. 8, pp. 21-28, Jan. 1962.

Tong Zhang and Keshab K. Parhi; "Joint code and decoder design for implementation-oriented (3, k)-regular LDPC codes." Conference Record of the Thirty-Fifth Asilomar Conference on Signals, Systems and Computers, vol. 2, Nov. 4-7, 2001 pp. 1232-1236.

Tong Zhang and Keshab K. Parhi; "VLSI Implementation-Oriented (2,k)-Regular Low-Density Parity-Check Codes," IEEE Workshop on Signal Processing Systems; Sep. 26-28, 2001 pp. 25-36.

Tong Zhang and Keshab K. Parhi; "A 54 MBPS (3,6)-Regular FPGA LDPC Decoder," IEEE Workshop on Signal Processing Systems; Oct. 16-18, 2002 pp. 127-132.

Yazdani, M.R., "On Construction of Rate-Compatible Low-Density Parity-Check Codes", IEEE Communications Letters, vol. 8, No. 3, Mar. 2004.

Classon, B., et al., "LDPC Coding for OFDMA PHY", IEEE 802.16 Broadband Wireless Access Working Group, IEEE C802.16e-04/374, Aug. 24, 2004.

Joo, P., et al., "LDPC Coding for OFDMA PHY", IEEE 802.16 Broadband Wireless Access Working Group, IEEE C802.16d-04/86r1, XP-002438609, May 1, 2004.

Oh et al., "Informative: LDPC parallel processing in IEEE802.16e," IEEE 802.16 Broadband Wireless Access Working Group, IEEE C802.16e-06/168, Mar. 2005.

Classon et al., "LDPC coding for OFDMA PHY," IEEE 802.16 Broadband Wireless Access Working Group, IEEE C802.16e-05/006, Jan. 2005, XP-002509951.

Classon et al., "LDPC coding for OFDMA PHY," IEEE 802.16 Broadband Wireless Access Working Group, IEEE C802.16e-04/372, Aug. 2004, XP-002593119.

Classon, et al., "LDPC coding for OFDMA PHY", IEEE C802.16e-04/278r1, Aug. 2004.

Classon, et al., "LDPC coding for OFDMA PHY", IEEE C802.16E-04/374, Aug. 2004.

Classon, et al., "LDPC coding for OFDMA PHY", IEEE C802.16E-05/0066r3, Jan. 2005.

Xu, et al., "High Girth LDPC coding for OFDMA PHY", IEEE C802.16e-05/031r1, Jan. 2005.

Oh, et al., "LDPC coding for OFDMA PHY", IEEE C802.16e-04/487r3, Nov. 2004.

B. Kiernan, "IEEE 802.16 TGe Session #35 Meeting Minutes", IEEE 802.16 Broadband Wireless Access Working Group, IEEE 802.16e-05/003, Jan. 2005.

G. Even et al., "A dual precision IEEE floating-point multiplier", Integration, The VLSI Journal, vol. 29, No. 2, Sep. 2000, pp. 167-180, XP-004237637.

The Math Forum @ Drexel: Teaching Rounding Rules, Aug. 27, 2003.

Classon, B., et al., "LDPC Coding for OFDMA PHY", IEEE 802.16 Broadband Wireless Access Working Group, IEEE C802.16e-04/278r1, Aug. 17, 2004.

Classon, B., et al., "LDPC Coding for OFDMA PHY," IEEE 802.16 Broadband Wireless Access Working Group, IEEE C802.16e-05/066r3, Jan. 27, 2005.

Index of /tge/contrib, pp. 1 and 40, Date: Unknown.

IEEE 802.16e Task Group (Mobile WirelessMAN®), pp. 1, 4, 31-34, Date: Unknown.

European Patent Office Application Serial No. 05756780.2, Office Action dated May 31, 2012, 11 pages (Relevant p. 7 (identified at top of page as "Sheet 4")).

* cited by examiner

FIG. 3

$$H = \begin{bmatrix} P_{0,0} & P_{0,1} & P_{0,2} & \cdots & P_{0,n_b-2} & P_{0,n_b-2} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

FIG. 5A $$\begin{pmatrix} -1\ 29\text{-}1\ 68\text{-}1\text{-}1\text{-}1\text{-}1\ 63\text{-}118\text{-}1\text{-}1\ 64\text{-}1\text{-}1\ 84\text{-}1\ \text{-}1\ 31\text{-}1\ 4\text{-}1\text{-}1\text{-}1\ 28\text{-}1\text{-}1\text{-}1\ 24\text{-}1\ 50\text{-}1\text{-}1\text{-}1\ 62 & 0\ 0\text{-}1\text{-}1\text{-}1\text{-}1\text{-}1\text{-}1\text{-}1\text{-}1\text{-}1\text{-}1\text{-}1\text{-}1\text{-}1 \\ 90\text{-}1\text{-}1\text{-}1\ 50\text{-}1\text{-}1\ 63\text{-}1\text{-}1\text{-}1\ 53\text{-}1\text{-}1\ 86\ 88\text{-}1\text{-}1\text{-}1\text{-}1\ 59\text{-}1\text{-}1\ 54\text{-}1\ 59\ 64\text{-}1\text{-}1\text{-}1\ 26\text{-}1\ 30\text{-}1 & \text{-}1\ 0\ 0\ 0\text{-}1\text{-}1\text{-}1\text{-}1\text{-}1\text{-}1\text{-}1\text{-}1\text{-}1\text{-}1\text{-}1\text{-}1 \\ \text{-}1\text{-}1\ 28\text{-}1\text{-}1\ 69\ 52\text{-}1\text{-}1\ 23\text{-}1\text{-}1\ 55\text{-}1\text{-}1\text{-}1\ 38\ 42\text{-}1\text{-}1\text{-}1\ 92\text{-}151\text{-}1\text{-}1\text{-}1\ 46\text{-}1\ 56\text{-}1\ 28\text{-}1\text{-}1 & \text{-}1\text{-}1\ 0\ 0\ 0\text{-}1\text{-}1\text{-}1\text{-}1\text{-}1\text{-}1\text{-}1\text{-}1\text{-}1\text{-}1\text{-}1 \\ \text{-}1\text{-}1\ 4\text{-}1\ 95\text{-}1\text{-}1\text{-}17\text{-}1\text{-}1\ 61\ 71\text{-}1\text{-}1\text{-}1\ 70\text{-}173\text{-}1\text{-}1\text{-}1\ 12\text{-}194\text{-}1\text{-}1\text{-}1\ 25\text{-}1\text{-}124\ 75\text{-}1 & \text{-}1\text{-}1\text{-}1\ 0\ 0\ 0\text{-}1\text{-}1\text{-}1\text{-}1\text{-}1\text{-}1\text{-}1\text{-}1\text{-}1\text{-}1 \\ 72\text{-}1\text{-}136\text{-}1\text{-}1\text{-}1\text{-}147\ 45\text{-}1\text{-}1\text{-}1\ 171\text{-}1\text{-}1\text{-}1\ 121\text{-}1\text{-}1\ 7\ 49\text{-}1\text{-}1\text{-}1\text{-}1\ 61\ \text{-}160\text{-}169\text{-}1\text{-}1\text{-}1\ 40\text{-}1 & \text{-}1\text{-}1\text{-}1\text{-}1\ 0\ 0\ 0\text{-}1\text{-}1\text{-}1\text{-}1\text{-}1\text{-}1\text{-}1\text{-}1\text{-}1 \\ \text{-}18\text{-}1\text{-}187\ 45\text{-}1\text{-}1\ \text{-}1\text{-}1\text{-}1\text{-}1\text{-}166\ 75\text{-}1\text{-}1\text{-}179\text{-}1\text{-}145\text{-}175\text{-}1\text{-}1\ 8\text{-}1\text{-}1\ 57\text{-}1\text{-}1\text{-}1\ 56 & \text{-}1\text{-}1\text{-}1\text{-}1\text{-}1\ 0\ 0\ 0\text{-}1\text{-}1\text{-}1\text{-}1\text{-}1\text{-}1\text{-}1\text{-}1 \\ \text{-}1\ 56\ 41\text{-}1\text{-}1\text{-}1\ 170\text{-}1\ \text{-}1\text{-}1\ 7\ 70\text{-}1\text{-}1\ 0\ \text{-}1\text{-}1\text{-}192\text{-}1\text{-}1\ 34\text{-}1\ 182\ 39\ \text{-}1\text{-}1\text{-}118\text{-}1\text{-}1\text{-}1\ 6 & 0\text{-}1\text{-}1\text{-}1\text{-}1\text{-}1\ 0\ 0\ 0\text{-}1\text{-}1\text{-}1\text{-}1\text{-}1\text{-}1\text{-}1 \\ 46\text{-}1\text{-}1\text{-}135\text{-}135\text{-}1\text{-}1\text{-}122\text{-}1\text{-}1\text{-}115\text{-}1\text{-}166\text{-}185\ \text{-}170\text{-}1\text{-}1\text{-}19\ \text{-}1\ \text{-}145\text{-}1\text{-}1\text{-}13\text{-}33\text{-}1\text{-}1 & \text{-}1\text{-}1\text{-}1\text{-}1\text{-}1\text{-}1\text{-}1\ 0\ 0\ 0\text{-}1\text{-}1\text{-}1\text{-}1\text{-}1\text{-}1 \\ \text{-}130\text{-}1\text{-}1\text{-}137\ 78\text{-}1\text{-}1\text{-}147\text{-}177\text{-}1\text{-}168\text{-}1\text{-}187\text{-}161\text{-}1\text{-}1\ \text{-}1\text{-}1\text{-}1\text{-}18182\text{-}1\text{-}1\text{-}194\text{-}1 & \text{-}1\text{-}1\text{-}1\text{-}1\text{-}1\text{-}1\text{-}1\text{-}1\ 0\ 0\ 0\text{-}1\text{-}1\text{-}1\text{-}1\text{-}1 \\ \text{-}134\text{-}1\text{-}1\text{-}169\text{-}130\text{-}1\ \text{-}1\text{-}19\ 80\ \text{-}1\text{-}1\text{-}1\ 59\ 77\text{-}1\text{-}1\text{-}1\text{-}132\text{-}192\text{-}123\ \text{-}1\text{-}1\ 3\ \text{-}1\text{-}1\text{-}1 & \text{-}1\text{-}1\text{-}1\text{-}1\text{-}1\text{-}1\text{-}1\text{-}1\text{-}1\ 0\ 0\ 0\text{-}1\text{-}1\text{-}1\text{-}1 \\ \text{-}1\text{-}1\ 163\ 9\text{-}1\text{-}1\text{-}192\ \text{-}162\text{-}1\text{-}1\text{-}1\ 179\text{-}195\text{-}1\text{-}1\text{-}1\ 56\ 69\text{-}1\text{-}1\text{-}1\ 92\text{-}1\text{-}127\text{-}1\text{-}143\ 28\text{-}1 & \text{-}1\text{-}1\text{-}1\text{-}1\text{-}1\text{-}1\text{-}1\text{-}1\text{-}1\text{-}1\ 0\ 0\ 0\text{-}1\text{-}1\text{-}1 \\ 34\text{-}147\text{-}1\text{-}1\text{-}143\text{-}1\text{-}1\ 31\text{-}132\text{-}1\text{-}187\text{-}157\text{-}1\text{-}1\ 41\text{-}1\text{-}1\ 12\text{-}148\text{-}1\ \text{-}1\text{-}1\ 85\text{-}1\text{-}1\text{-}149\text{-}1\text{-}122 & 0\text{-}1\text{-}1\text{-}1\text{-}1\text{-}1\text{-}1\text{-}1\text{-}1\text{-}1\text{-}1\ 0\ \text{-}1\text{-}1\text{-}1\ 0 \end{pmatrix}$$

FIG. 5B

FIG. 5C $$\begin{bmatrix}
-1 & 20 & -1 & 175 & -1 & -1 & -1 & 70 & -1 & 18 & -1 & -1 & 6 & -1 & -1 & 65 & -1 & -1 & 121 & -1 & 185 & -1 & -1 & -1 & 65 & -1 & -1 & 25 & -1 & 8 & -1 & -1 & -1 & 135 & -1 & 0 & 0 & -1 & -1 & -1 & -1 & -1 & -1 & -1 & -1 & -1 & -1 & -1 \\
90 & -1 & -1 & 50 & -1 & -1 & 63 & -1 & -1 & -1 & 53 & -1 & -1 & 85 & 76 & -1 & -1 & -1 & -1 & 118 & -1 & -1 & 48 & -1 & 139 & 35 & -1 & -1 & -1 & -1 & 135 & -1 & -1 & 0 & 0 & -1 & -1 & -1 & -1 & -1 & -1 & -1 & -1 & -1 & -1 & -1 & -1 \\
-1 & -1 & 28 & -1 & -1 & 69 & 52 & -1 & -1 & 23 & -1 & -1 & 47 & -1 & -1 & -1 & 20 & 84 & -1 & -1 & -1 & 46 & -1 & 95 & -1 & -1 & -1 & 33 & -1 & 86 & -1 & 48 & -1 & -1 & -1 & -1 & 0 & 0 & -1 & -1 & -1 & -1 & -1 & -1 & -1 & -1 & -1 & -1 \\
-1 & 78 & -1 & -1 & 11 & -1 & -1 & 6 & -1 & -1 & 85 & 79 & -1 & -1 & -1 & 70 & 127 & -1 & -1 & -1 & -1 & 75 & -1 & 3 & -1 & -1 & 190 & -1 & 30 & 44 & -1 & -1 & -1 & -1 & -1 & 0 & 0 & -1 & -1 & -1 & -1 & -1 & -1 & -1 & -1 & -1 & -1 \\
72 & -1 & -1 & 36 & -1 & -1 & -1 & 47 & 45 & -1 & -1 & -1 & 38 & -1 & -1 & 27 & -1 & -1 & 34 & 82 & -1 & -1 & -1 & 89 & -1 & 68 & 134 & -1 & -1 & -1 & 73 & -1 & -1 & -1 & -1 & -1 & -1 & 0 & 0 & -1 & -1 & -1 & -1 & -1 & -1 & -1 & -1 & -1 \\
-1 & 8 & -1 & -1 & 187 & 45 & -1 & -1 & -1 & 91 & -1 & -1 & -1 & 63 & 71 & -1 & -1 & 171 & -1 & -1 & 115 & -1 & 66 & -1 & 55 & -1 & -1 & 23 & -1 & -1 & 130 & -1 & -1 & -1 & -1 & -1 & -1 & -1 & 0 & 0 & -1 & -1 & -1 & -1 & -1 & -1 & -1 \\
-1 & 67 & 39 & -1 & -1 & 183 & -1 & -1 & 58 & 2 & -1 & -1 & -1 & 58 & -1 & -1 & 119 & -1 & -1 & 84 & -1 & 182 & -1 & 131 & 22 & -1 & -1 & -1 & 5 & -1 & -1 & 158 & -1 & -1 & -1 & -1 & -1 & -1 & -1 & 0 & 0 & -1 & -1 & -1 & -1 & -1 & -1 \\
46 & -1 & -1 & 135 & -1 & 135 & -1 & -1 & -1 & 122 & -1 & -1 & 115 & -1 & -1 & 66 & 185 & -1 & 170 & -1 & -1 & 19 & -1 & -1 & 45 & -1 & -1 & -1 & 13 & -1 & 33 & -1 & -1 & -1 & 0 & -1 & -1 & -1 & -1 & -1 & 0 & 0 & -1 & -1 & -1 & -1 & -1 \\
-1 & 40 & -1 & -1 & 163 & -1 & -1 & 132 & 79 & -1 & -1 & 17 & -1 & 35 & -1 & 166 & -1 & -1 & -1 & 114 & 126 & -1 & -1 & -1 & -1 & 73 & 55 & -1 & -1 & 42 & -1 & -1 & -1 & -1 & -1 & -1 & -1 & -1 & -1 & -1 & -1 & 0 & 0 & -1 & -1 & -1 & -1 \\
-1 & 67 & -1 & -1 & 169 & -1 & 30 & -1 & -1 & 132 & 85 & 28 & -1 & -1 & -1 & 18 & 11 & -1 & -1 & -1 & -1 & 176 & -1 & 40 & -1 & 195 & -1 & 42 & -1 & -1 & -1 & 74 & -1 & -1 & -1 & -1 & -1 & -1 & -1 & -1 & -1 & -1 & 0 & 0 & -1 & -1 & -1 \\
-1 & -1 & 63 & 9 & -1 & -1 & 192 & -1 & 62 & -1 & -1 & -1 & 69 & 89 & -1 & -1 & 94 & 63 & -1 & -1 & -1 & 77 & -1 & 72 & -1 & 19 & 60 & -1 & -1 & -1 & -1 & -1 & -1 & -1 & -1 & -1 & -1 & -1 & -1 & -1 & -1 & -1 & -1 & 0 & 0 & -1 & -1 \\
34 & -1 & 47 & -1 & -1 & 43 & -1 & -1 & 31 & -1 & -1 & -1 & 175 & -1 & 124 & -1 & -1 & 42 & -1 & 113 & -1 & 187 & -1 & -1 & 88 & -1 & -1 & 42 & -1 & -1 & 110 & -1 & -1 & -1 & -1 & -1 & -1 & -1 & -1 & -1 & -1 & -1 & -1 & -1 & 0 & 0 & -1 \\
\end{bmatrix}$$

FIG. 5D $$\begin{pmatrix}
-1\ 20\ -1\ 75\ -1\ -1\ -1\ 70\ -1\ 18\ -1\ -1\ 6\ -1\ -1\ 65\ -1\ -1\ 21\ -1\ 85\ -1\ -1\ -1\ 65\ -1\ -1\ 25\ -1\ 8\ -1\ -1\ -1\ 29 & 0\ 0\ -1\ -1\ -1\ -1\ -1\ -1\ -1\ -1\ -1\ -1\ -1\ -1\ -1\ -1\ -1\ -1\ -1\ -1\ -1\ -1\ -1\ -1 \\
90\ -1\ -1\ 50\ -1\ -1\ 63\ -1\ -1\ -1\ 53\ -1\ -1\ 85\ 76\ -1\ -1\ -1\ 18\ -1\ -1\ 48\ -1\ -1\ 39\ 35\ -1\ -1\ -1\ 35\ -1\ 35\ -1 & -1\ 0\ 0\ -1\ -1\ -1\ -1\ -1\ -1\ -1\ -1\ -1\ -1\ -1\ -1\ -1\ -1\ -1\ -1\ -1\ -1\ -1\ -1\ -1 \\
-1\ -1\ 28\ -1\ -1\ 69\ 52\ -1\ -1\ 23\ -1\ -1\ 47\ -1\ -1\ 20\ 84\ -1\ -1\ -1\ 46\ -1\ 95\ -1\ -1\ -1\ 33\ -1\ 86\ -1\ 48\ -1\ -1 & -1\ -1\ 0\ 0\ -1\ -1\ -1\ -1\ -1\ -1\ -1\ -1\ -1\ -1\ -1\ -1\ -1\ -1\ -1\ -1\ -1\ -1\ -1\ -1 \\
-1\ 78\ -1\ 11\ -1\ -1\ 6\ -1\ -1\ 85\ 79\ -1\ -1\ -1\ 70\ -1\ 27\ -1\ -1\ -1\ -1\ 75\ -1\ 3\ -1\ -1\ -1\ 90\ -1\ 30\ 44\ -1\ -1 & -1\ -1\ -1\ 0\ 0\ -1\ -1\ -1\ -1\ -1\ -1\ -1\ -1\ -1\ -1\ -1\ -1\ -1\ -1\ -1\ -1\ -1\ -1\ -1 \\
72\ -1\ 136\ -1\ -1\ -1\ 47\ 45\ -1\ -1\ -1\ 38\ -1\ -1\ 127\ -1\ -1\ 34\ 82\ -1\ -1\ -1\ 89\ -1\ 68\ -1\ 34\ -1\ -1\ -1\ 73\ -1 & -1\ -1\ -1\ -1\ 0\ 0\ -1\ -1\ -1\ -1\ -1\ -1\ -1\ -1\ -1\ -1\ -1\ -1\ -1\ -1\ -1\ -1\ -1\ -1 \\
-1\ 8\ -1\ -1\ 87\ 45\ -1\ -1\ -1\ 91\ -1\ -1\ 163\ 71\ -1\ -1\ -1\ 71\ -1\ 15\ -1\ 66\ -1\ -1\ 55\ -1\ -1\ -1\ 23\ -1\ -1\ -1\ 30 & -1\ -1\ -1\ -1\ -1\ 0\ 0\ -1\ -1\ -1\ -1\ -1\ -1\ -1\ -1\ -1\ -1\ -1\ -1\ -1\ -1\ -1\ -1\ -1 \\
-1\ 167\ 39\ -1\ -1\ 183\ -1\ -1\ 58\ 2\ -1\ -1\ 119\ -1\ -1\ 184\ -1\ -1\ 82\ -1\ 131\ 22\ -1\ -1\ -1\ 5\ -1\ -1\ -1\ 58 & 0\ -1\ -1\ -1\ -1\ -1\ 0\ 0\ -1\ -1\ -1\ -1\ -1\ -1\ -1\ -1\ -1\ -1\ -1\ -1\ -1\ -1\ -1\ -1 \\
46\ -1\ -1\ 35\ -1\ 35\ -1\ -1\ -1\ 22\ -1\ -1\ 15\ -1\ 66\ -1\ 85\ -1\ 70\ -1\ -1\ 19\ -1\ -1\ 45\ -1\ -1\ 3\ -33\ -1\ -1 & -1\ 0\ -1\ -1\ -1\ -1\ -1\ 0\ 0\ -1\ -1\ -1\ -1\ -1\ -1\ -1\ -1\ -1\ -1\ -1\ -1\ -1\ -1\ -1 \\
-1\ 40\ -1\ -1\ 63\ -1\ 132\ 79\ -1\ -1\ 117\ -1\ 35\ -1\ 166\ -1\ -1\ 14\ 126\ -1\ -1\ -1\ 73\ 55\ -1\ -1\ 42\ -1\ -1\ -1 & -1\ -1\ 0\ -1\ -1\ -1\ -1\ -1\ 0\ 0\ -1\ -1\ -1\ -1\ -1\ -1\ -1\ -1\ -1\ -1\ -1\ -1\ -1\ -1 \\
-1\ 67\ -1\ -1\ 69\ 130\ -1\ -1\ 132\ 85\ 28\ -1\ -1\ 18\ 11\ -1\ -1\ -1\ 76\ -1\ 40\ -1\ 95\ -1\ 42\ -1\ -1\ -1\ -1 & -1\ -1\ -1\ 0\ -1\ -1\ -1\ -1\ -1\ 0\ 0\ -1\ -1\ -1\ -1\ -1\ -1\ -1\ -1\ -1\ -1\ -1\ -1\ -1 \\
-1\ -1\ 163\ 9\ -1\ -1\ 192\ -1\ 62\ -1\ -1\ 69\ 189\ -1\ -1\ 94\ 63\ -1\ -1\ -1\ 77\ -1\ 172\ -1\ 19\ 60\ -1\ -1 & -1\ -1\ -1\ -1\ 0\ -1\ -1\ -1\ -1\ -1\ 0\ 0\ -1\ -1\ -1\ -1\ -1\ -1\ -1\ -1\ -1\ -1\ -1\ -1 \\
34\ -1\ 47\ -1\ -1\ 143\ -1\ 31\ -1\ -1\ 175\ -1\ 124\ -1\ -1\ 142\ -1\ 113\ 187\ -1\ -1\ 188\ -1\ 42\ -1\ -1\ 10 & -1\ -1\ -1\ -1\ -1\ 0\ -1\ -1\ -1\ -1\ -1\ 0
\end{pmatrix}$$

FIG. 5E $$\begin{pmatrix}
-1\ 20\ -1\ 75\ -1\ -1\ -1\ -1\ 70\ -1\ 18\ -1\ -1\ 53\ -1\ -1\ 16\ -1\ -1\ 65\ -1\ -1\ 21\ -1\ 85\ -1\ -1\ -1\ -1\ 65\ -1\ -1\ 25\ -1\ 8\ -1\ -1\ -1\ 29 & 1\ 0\ -1\ -1\ -1\ -1\ -1\ -1\ -1\ -1\ -1\ -1\ -1\ -1\ -1\ -1\ -1\ -1\ -1\ -1\ -1\ -1\ -1\ -1 \\
90\ -1\ -1\ 50\ -1\ -1\ 63\ -1\ -1\ -1\ -1\ 85\ 76\ -1\ -1\ -1\ -1\ 18\ -1\ -1\ 48\ -1\ -1\ 39\ 35\ -1\ -1\ -1\ -1\ 35\ -1\ 35\ -1 & -1\ 0\ 0\ -1\ -1\ 0\ 0\ -1\ -1\ 0\ -1\ -1\ -1\ -1\ -1\ -1\ -1\ -1\ -1\ -1\ -1\ -1\ -1\ -1 \\
-1\ -1\ 28\ -1\ -1\ 69\ 52\ -1\ -1\ 23\ -1\ -1\ 47\ -1\ -1\ -1\ -1\ 20\ 84\ -1\ -1\ -1\ 46\ -1\ 95\ -1\ -1\ -1\ -1\ 33\ -1\ 86\ -1\ 48\ -1\ -1 & -1\ -1\ 0\ 0\ -1\ -1\ 0\ 0\ -1\ -1\ 0\ -1\ -1\ -1\ -1\ -1\ -1\ -1\ -1\ -1\ -1\ -1\ -1\ -1 \\
-1\ 78\ -1\ 11\ -1\ -1\ 6\ -1\ -1\ 85\ 79\ -1\ -1\ -1\ 70\ -1\ 27\ -1\ -1\ -1\ 75\ -1\ 3\ -1\ -1\ -1\ 90\ -1\ -1\ 30\ 44\ -1\ -1 & -1\ -1\ -1\ 0\ 0\ -1\ -1\ 0\ 0\ -1\ -1\ 0\ -1\ -1\ -1\ -1\ -1\ -1\ -1\ -1\ -1\ -1\ -1\ -1 \\
72\ -1\ -1\ 136\ -1\ -1\ -1\ -1\ 47\ 45\ -1\ -1\ -1\ 38\ -1\ -1\ -1\ 27\ -1\ -1\ 34\ 82\ -1\ -1\ -1\ 89\ -1\ 68\ -1\ 34\ -1\ -1\ -1\ 73\ -1 & -1\ -1\ -1\ -1\ 0\ 0\ -1\ -1\ 0\ 0\ -1\ -1\ 0\ -1\ -1\ -1\ -1\ -1\ -1\ -1\ -1\ -1\ -1\ -1 \\
-1\ 8\ -1\ -1\ 187\ 45\ -1\ -1\ -1\ 91\ -1\ -1\ 63\ 71\ -1\ -1\ -1\ 71\ -1\ 15\ -1\ 66\ -1\ -1\ 55\ -1\ -1\ 23\ -1\ -1\ -1\ 30 & -1\ -1\ -1\ -1\ -1\ 0\ 0\ -1\ -1\ 0\ 0\ -1\ -1\ 0\ -1\ -1\ -1\ -1\ -1\ -1\ -1\ -1\ -1\ -1 \\
-1\ -1\ 67\ 39\ -1\ -1\ 83\ -1\ -1\ 58\ 2\ -1\ -1\ 19\ -1\ -1\ -1\ 84\ -1\ -1\ 82\ -1\ 131\ 22\ -1\ -1\ 5\ -1\ -1\ 58 & 0\ -1\ -1\ -1\ -1\ -1\ 0\ 0\ -1\ -1\ 0\ 0\ -1\ -1\ -1\ -1\ -1\ -1\ -1\ -1\ -1\ -1\ -1\ -1 \\
46\ -1\ -1\ 35\ 135\ -1\ -1\ -1\ 22\ -1\ -1\ 15\ -1\ 166\ 185\ -1\ 70\ -1\ -1\ 19\ -1\ -1\ 45\ -1\ -1\ 13\ 33\ -1\ -1 & -1\ 0\ -1\ -1\ -1\ -1\ -1\ -1\ 0\ 0\ -1\ -1\ 0\ 0\ -1\ -1\ -1\ -1\ -1\ -1\ -1\ -1\ -1\ -1 \\
-1\ 40\ -1\ -1\ 63\ -1\ -1\ 32\ 79\ -1\ -1\ -1\ 17\ -1\ 35\ -1\ 66\ -1\ -1\ 14\ -1\ 26\ -1\ -1\ -1\ 73\ 55\ -1\ -1\ 74\ -1 & -1\ -1\ 0\ -1\ -1\ -1\ -1\ -1\ -1\ 0\ 0\ -1\ -1\ 0\ 0\ -1\ -1\ -1\ -1\ -1\ -1\ -1\ -1\ -1 \\
-1\ 67\ -1\ -1\ 69\ -1\ 130\ -1\ -1\ -1\ 32\ 85\ 28\ -1\ -1\ 18\ 11\ -1\ -1\ -1\ 76\ -1\ 40\ -1\ -1\ 195\ -1\ 42\ -1\ -1 & -1\ -1\ -1\ 0\ -1\ -1\ -1\ -1\ -1\ -1\ 0\ 0\ -1\ -1\ 0\ 0\ -1\ -1\ -1\ -1\ -1\ -1\ -1\ -1 \\
-1\ -1\ 63\ 9\ -1\ -1\ 192\ -1\ 62\ -1\ -1\ -1\ 69\ -1\ 89\ -1\ -1\ 94\ 63\ -1\ -1\ -1\ 77\ -1\ -1\ 72\ -1\ 19\ 60\ -1 & -1\ -1\ -1\ -1\ 0\ -1\ -1\ -1\ -1\ -1\ -1\ 0\ 0\ -1\ -1\ 0\ 0\ -1\ -1\ -1\ -1\ -1\ -1\ -1 \\
34\ -1\ 47\ -1\ -1\ 43\ -1\ -1\ 31\ -1\ -1\ 75\ -1\ 124\ -1\ -1\ -1\ 42\ -1\ -1\ 113\ -1\ 187\ -1\ -1\ 188\ -1\ 42\ -1\ 110 & 1\ -1\ -1\ -1\ -1\ -1\ 0\ -1\ -1\ -1\ -1\ -1\ -1\ 0\ 0\ -1\ -1\ -1\ -1\ -1\ -1\ -1\ -1\ 0
\end{pmatrix}$$

FIG. 5F $$\begin{pmatrix}
-1\ 20\ -1\ -1\ -1\ 70\ -1\ 18\ -1\ -1\ 6\ -1\ -1\ 65\ -1\ -1\ 21\ -1\ -1\ 85\ -1\ -1\ -1\ 65\ -1\ -1\ 25\ -1\ 8\ -1\ -1\ -1\ 29 & 1\ 0\ -1\ -1\ -1\ -1\ -1\ -1\ -1\ -1\ -1\ -1\ -1\ -1\ -1\ -1\ -1\ -1\ -1\ -1\ -1\ -1\ -1\ -1 \\
90\ -1\ -1\ -1\ 50\ -1\ -1\ 63\ -1\ -1\ -1\ 53\ -1\ -1\ 85\ 76\ -1\ -1\ -1\ 18\ -1\ -1\ 48\ -1\ -1\ 39\ 35\ -1\ -1\ -1\ 35\ -1\ 135\ -1 & -1\ 0\ 0\ -1\ -1\ 0\ 0\ -1\ -1\ -1\ -1\ -1\ -1\ -1\ -1\ -1\ -1\ -1\ -1\ -1\ -1\ -1\ -1\ -1 \\
-1\ 28\ -1\ -1\ 69\ 52\ -1\ -1\ 23\ -1\ -1\ 47\ -1\ -1\ -1\ 20\ 84\ -1\ -1\ -1\ 46\ -1\ 95\ -1\ -1\ -1\ 33\ -1\ 86\ -1\ 48\ -1\ -1 & -1\ -1\ 0\ 0\ -1\ -1\ 0\ 0\ -1\ -1\ -1\ -1\ -1\ -1\ -1\ -1\ -1\ -1\ -1\ -1\ -1\ -1\ -1\ -1 \\
-1\ 178\ -1\ 11\ -1\ -1\ 6\ -1\ -1\ 185\ 79\ -1\ -1\ -1\ 70\ -1\ 127\ -1\ -1\ -1\ 75\ -1\ 3\ -1\ -1\ 190\ -1\ 30\ 44\ -1\ -1 & -1\ -1\ -1\ 0\ 0\ -1\ -1\ 0\ 0\ -1\ -1\ -1\ -1\ -1\ -1\ -1\ -1\ -1\ -1\ -1\ -1\ -1\ -1\ -1 \\
72\ -1\ -1\ 36\ -1\ -1\ -1\ -1\ 47\ 45\ -1\ -1\ -1\ 38\ -1\ -1\ 127\ -1\ -1\ 34\ 82\ -1\ -1\ 89\ -1\ 68\ -1\ 34\ -1\ -1\ -1\ 73\ -1 & -1\ -1\ -1\ -1\ 0\ 0\ -1\ -1\ 0\ 0\ -1\ -1\ -1\ -1\ -1\ -1\ -1\ -1\ -1\ -1\ -1\ -1\ -1\ -1 \\
-1\ 8\ -1\ -1\ 187\ 45\ -1\ -1\ 91\ -1\ -1\ -1\ 63\ 71\ -1\ -1\ 15\ -1\ -1\ 66\ -1\ -1\ 55\ -1\ 23\ -1\ -1\ 130 & -1\ -1\ -1\ -1\ -1\ 0\ 0\ -1\ -1\ 0\ 0\ -1\ -1\ -1\ -1\ -1\ -1\ -1\ -1\ -1\ -1\ -1\ -1\ -1 \\
-1\ 67\ 39\ -1\ -1\ 83\ -1\ -1\ -1\ 58\ 2\ -1\ -1\ 19\ -1\ -1\ 84\ -1\ -1\ 82\ -1\ 131\ 22\ -1\ -1\ 5\ -1\ -1\ -1\ 58 & -1\ -1\ -1\ -1\ -1\ -1\ 0\ 0\ -1\ -1\ 0\ 0\ -1\ -1\ -1\ -1\ -1\ -1\ -1\ -1\ -1\ -1\ -1\ -1 \\
46\ -1\ -1\ 135\ -1\ 35\ -1\ -1\ 22\ -1\ -1\ 15\ -1\ -1\ 66\ -1\ 185\ -1\ 70\ -1\ -1\ 19\ -1\ -1\ 45\ -1\ -1\ 3\ -33\ -1\ -1 & -1\ -1\ -1\ -1\ -1\ -1\ -1\ 0\ 0\ -1\ -1\ 0\ 0\ -1\ -1\ -1\ -1\ -1\ -1\ -1\ -1\ -1\ -1\ -1 \\
-1\ 40\ -1\ -1\ 63\ -1\ -1\ 69\ -30\ -1\ -1\ 32\ 79\ -1\ -1\ 17\ -1\ 35\ -1\ 66\ -1\ -1\ 14\ -1\ 26\ -1\ -1\ 73\ 55\ -1\ -1\ 74\ -1 & -1\ -1\ -1\ -1\ -1\ -1\ -1\ -1\ 0\ 0\ -1\ -1\ 0\ 0\ -1\ -1\ -1\ -1\ -1\ -1\ -1\ -1\ -1\ -1 \\
-1\ 67\ -1\ -1\ 69\ -30\ -1\ -1\ -1\ 32\ 85\ 28\ -1\ -1\ -1\ 8\ 11\ -1\ -1\ 69\ -1\ -1\ 76\ -140\ -1\ -1\ 195\ -1\ 42\ -1\ -1 & -1\ -1\ -1\ -1\ -1\ -1\ -1\ -1\ -1\ 0\ 0\ -1\ -1\ 0\ 0\ -1\ -1\ -1\ -1\ -1\ -1\ -1\ -1\ -1 \\
-1\ -1\ 63\ 9\ -1\ -1\ 92\ -1\ 62\ -1\ -1\ -1\ 69\ 189\ -1\ -1\ 94\ 63\ -1\ -1\ -1\ 77\ -1\ 172\ -1\ 9\ 60\ -1 & -1\ -1\ -1\ -1\ -1\ -1\ -1\ -1\ -1\ -1\ 0\ 0\ -1\ -1\ 0\ 0\ -1\ -1\ -1\ -1\ -1\ -1\ -1\ -1 \\
34\ -1\ 47\ -1\ -1\ 43\ -1\ -1\ 31\ -1\ -1\ 75\ -124\ -1\ -1\ 42\ -1\ -1\ 113\ -187\ -1\ -1\ 88\ -1\ -1\ 42\ -1\ -1\ 110 & 1\ -1\ -1\ -1\ -1\ -1\ -1\ -1\ -1\ -1\ -1\ 0\ 0\ -1\ -1\ -1\ -1\ -1\ -1\ -1\ -1\ -1\ -1\ 0
\end{pmatrix}$$

FIG. 6

$$\begin{pmatrix}
-1 & 20 & -1 & 75 & -1 & -1 & -1 & -1 & 70 & -1 & 18 & -1 & 1 & 0 & -1 & -1 & -1 & -1 & -1 & -1 & -1 & -1 & -1 & -1 \\
90 & -1 & -1 & -1 & 50 & -1 & -1 & 63 & -1 & -1 & -1 & 53 & -1 & 0 & 0 & -1 & -1 & -1 & -1 & -1 & -1 & -1 & -1 & -1 \\
-1 & -1 & 28 & -1 & -1 & 69 & 52 & -1 & -1 & 23 & -1 & -1 & -1 & -1 & 0 & 0 & -1 & -1 & -1 & -1 & -1 & -1 & -1 & -1 \\
-1 & -1 & 78 & -1 & 11 & -1 & -1 & 6 & -1 & -1 & -1 & 85 & -1 & -1 & -1 & 0 & 0 & -1 & -1 & -1 & -1 & -1 & -1 & -1 \\
72 & -1 & -1 & 36 & -1 & -1 & -1 & -1 & 47 & 45 & -1 & -1 & -1 & -1 & -1 & -1 & 0 & 0 & -1 & -1 & -1 & -1 & -1 & -1 \\
-1 & 8 & -1 & -1 & -1 & 87 & 45 & -1 & -1 & -1 & 91 & -1 & -1 & -1 & -1 & -1 & -1 & 0 & 0 & -1 & -1 & -1 & -1 & -1 \\
-1 & -1 & 67 & 39 & -1 & -1 & -1 & 83 & -1 & -1 & -1 & 58 & 7 & -1 & -1 & -1 & -1 & -1 & 0 & 0 & -1 & -1 & -1 & -1 \\
46 & -1 & -1 & -1 & 35 & -1 & 35 & -1 & -1 & -1 & 22 & -1 & -1 & -1 & -1 & -1 & -1 & -1 & -1 & 0 & 0 & -1 & -1 & -1 \\
-1 & 40 & -1 & -1 & -1 & 63 & -1 & -1 & 32 & 79 & -1 & -1 & -1 & -1 & -1 & -1 & -1 & -1 & -1 & -1 & 0 & 0 & -1 & -1 \\
-1 & 67 & -1 & -1 & -1 & 69 & -1 & 30 & -1 & -1 & -1 & 32 & -1 & -1 & -1 & -1 & -1 & -1 & -1 & -1 & -1 & 0 & 0 & -1 \\
-1 & -1 & -1 & 63 & 9 & -1 & -1 & -1 & 92 & -1 & 62 & -1 & -1 & -1 & -1 & -1 & -1 & -1 & -1 & -1 & -1 & -1 & 0 & 0 \\
34 & -1 & 47 & -1 & -1 & -1 & 43 & -1 & -1 & 31 & -1 & -1 & 0 & -1 & -1 & -1 & -1 & -1 & -1 & -1 & -1 & -1 & -1 & 0
\end{pmatrix}$$

FIG. 7

$$\begin{pmatrix}
1 & -1 & 4 & -1 & -1 & 3 & 7 & -1 & -1 & 17 & -1 & 46 & 21 & -1 & -1 & 65 & 0 & 0 & -1 & -1 & -1 & -1 & -1 & -1 \\
-1 & 19 & -1 & 90 & 86 & -1 & -1 & 49 & 9 & -1 & 91 & -1 & -1 & 32 & 76 & -1 & -1 & 0 & 0 & -1 & -1 & -1 & -1 & -1 \\
-1 & 16 & -1 & 24 & 26 & -1 & -1 & 0 & -1 & 28 & -1 & 1 & 11 & -1 & 52 & -1 & 94 & -1 & 0 & 0 & -1 & -1 & -1 & -1 \\
39 & -1 & 61 & -1 & -1 & 92 & 53 & -1 & 58 & -1 & 38 & -1 & 88 & -1 & 66 & -1 & -1 & -1 & -1 & 0 & 0 & -1 & -1 & -1 \\
14 & -1 & -1 & 75 & 60 & -1 & -1 & 67 & -1 & 89 & -1 & 33 & -1 & 40 & -1 & 35 & 0 & -1 & -1 & -1 & 0 & 0 & -1 & -1 \\
-1 & 31 & 78 & -1 & -1 & 36 & 30 & -1 & 54 & -1 & 64 & -1 & 48 & -1 & 57 & -1 & -1 & -1 & -1 & -1 & -1 & 0 & 0 & -1 \\
-1 & 42 & -1 & 93 & -1 & -1 & 77 & 74 & -1 & -1 & 68 & -1 & 41 & 23 & -1 & -1 & -1 & -1 & -1 & -1 & -1 & -1 & 0 & 0 \\
34 & -1 & 84 & -1 & 82 & 6 & -1 & -1 & 72 & 5 & -1 & 87 & -1 & -1 & 15 & 37 & 0 & -1 & -1 & -1 & -1 & -1 & -1 & 0
\end{pmatrix}$$

FIG. 8

$$\begin{pmatrix}
14 & 42 & 84 & 38 & 81 & 78 & 41 & 95 & -1 & -1 & 46 & -1 & -1 & -1 & 74 & 68 & 23 & 0 & 95 & 0 & -1 & -1 & -1 & -1 \\
37 & 12 & -1 & -1 & 35 & -1 & 58 & 6 & 0 & 90 & -1 & 3 & 10 & 67 & 10 & -1 & -1 & 57 & -1 & 0 & 0 & -1 & -1 & -1 \\
31 & -1 & 88 & 11 & -1 & 66 & -1 & -1 & -1 & 49 & 5 & -1 & 38 & 45 & 53 & 10 & 44 & 92 & -1 & -1 & 0 & 0 & -1 & -1 \\
62 & 30 & 45 & 75 & 2 & 73 & 65 & 60 & 85 & 28 & 27 & 46 & -1 & -1 & -1 & -1 & -1 & -1 & 0 & -1 & -1 & 0 & 0 & -1 \\
-1 & 17 & -1 & -1 & 50 & -1 & -1 & -1 & 45 & -1 & 33 & 79 & 5 & 23 & 72 & 92 & 54 & 45 & -1 & -1 & -1 & -1 & 0 & 0 \\
-1 & -1 & 51 & 25 & -1 & 35 & 55 & 37 & 5 & 56 & -1 & 87 & 22 & 88 & -1 & 47 & 41 & -1 & 95 & -1 & -1 & -1 & -1 & 0
\end{pmatrix}$$

FIG. 9

| | | | | | | | | | | | | | | | | | | | | | | | |
|---|---|---|---|---|---|---|---|---|---|---|---|---|---|---|---|---|---|---|---|---|---|---|---|
| Layer_1 | 2 | -1 | 19 | -1 | 47 | -1 | 48 | -1 | 36 | -1 | 82 | -1 | 47 | -1 | 16 | -1 | 95 | 0 | -1 | -1 | -1 | -1 | -1 |
| Layer_2 | -1 | 28 | -1 | 32 | -1 | 81 | -1 | 27 | -1 | 85 | -1 | 5 | 5 | 56 | -1 | 37 | -1 | -1 | -1 | 0 | -1 | -1 | -1 |
| Layer_3 | 32 | -1 | 0 | -1 | 15 | -1 | 66 | -1 | 85 | -1 | 5 | 37 | 8 | -1 | 52 | -1 | 0 | -1 | -1 | 0 | -1 | -1 | 0 |
| Layer_4 | -1 | 69 | -1 | 88 | -1 | 33 | -1 | 3 | -1 | 16 | -1 | 37 | -1 | 40 | -1 | 48 | -1 | 0 | -1 | -1 | -1 | -1 | -1 |
| Layer_5 | 23 | -1 | 29 | -1 | 15 | -1 | 30 | -1 | 68 | -1 | 24 | -1 | 50 | -1 | 62 | -1 | -1 | -1 | 0 | -1 | -1 | 0 | -1 |
| Layer_6 | -1 | 0 | -1 | 47 | -1 | 13 | -1 | 61 | -1 | 84 | -1 | 55 | -1 | 70 | -1 | 41 | 95 | -1 | -1 | -1 | -1 | -1 | -1 |
| Layer_7 | 10 | -1 | 85 | -1 | 62 | -1 | 28 | -1 | 35 | -1 | 18 | 30 | 34 | -1 | 73 | -1 | -1 | -1 | -1 | 0 | -1 | 0 | -1 |
| Layer_8 | -1 | 30 | -1 | 65 | -1 | 54 | -1 | 14 | -1 | 0 | -1 | -1 | -1 | 74 | -1 | 0 | -1 | -1 | 0 | 0 | -1 | -1 | -1 |

FIG. 10B
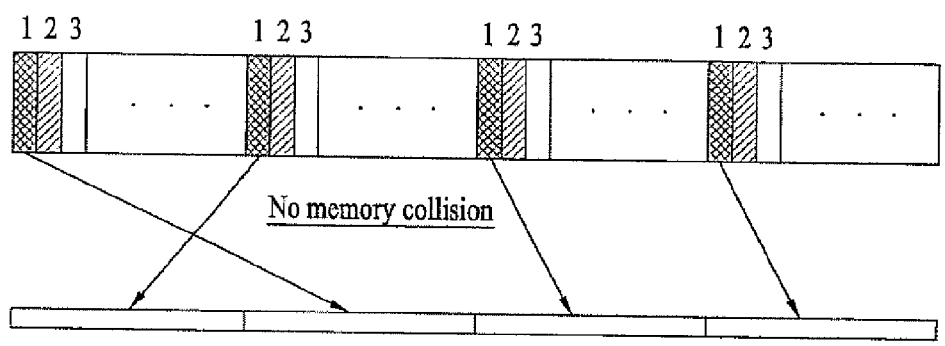
(a)
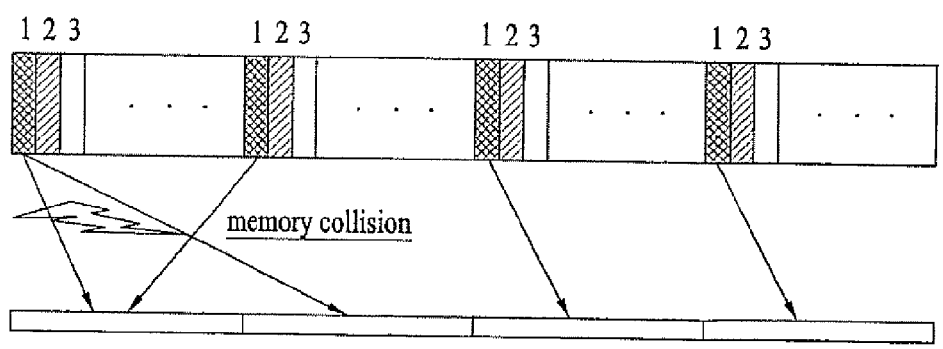
(b)

FIG. 11

$$\begin{pmatrix}
-1 & -1 & -1 & 2 & -1 & -1 & 12 & 70 & -1 & -1 & 24 & -1 & 95 & 0 & -1 & -1 & -1 & -1 & -1 & -1 & -1 & -1 & -1 & -1 \\
-1 & -1 & -1 & -1 & 91 & 32 & -1 & -1 & -1 & 79 & 56 & -1 & -1 & 0 & 0 & -1 & -1 & -1 & -1 & -1 & -1 & -1 & -1 & -1 \\
-1 & -1 & -1 & 11 & -1 & 79 & 10 & -1 & -1 & -1 & -1 & 36 & -1 & -1 & 0 & 0 & -1 & -1 & -1 & -1 & -1 & -1 & -1 & -1 \\
-1 & -1 & -1 & 59 & 16 & -1 & 77 & -1 & -1 & -1 & -1 & 78 & 0 & -1 & -1 & 0 & 0 & -1 & -1 & -1 & -1 & -1 & -1 & -1 \\
-1 & -1 & 18 & -1 & -1 & -1 & 64 & 91 & -1 & -1 & 3 & -1 & -1 & -1 & -1 & -1 & 0 & 0 & -1 & -1 & -1 & -1 & -1 & -1 \\
-1 & 73 & 47 & -1 & -1 & 53 & -1 & -1 & -1 & -1 & -1 & 41 & -1 & -1 & -1 & -1 & -1 & 0 & 0 & -1 & -1 & -1 & -1 & -1 \\
72 & 34 & -1 & -1 & -1 & -1 & -1 & -1 & 6 & -1 & -1 & 54 & -1 & -1 & -1 & -1 & -1 & -1 & 0 & 0 & -1 & -1 & -1 & -1 \\
56 & 10 & 40 & -1 & -1 & -1 & -1 & -1 & 29 & -1 & -1 & -1 & -1 & -1 & -1 & -1 & -1 & -1 & -1 & 0 & 0 & -1 & -1 & -1 \\
-1 & -1 & 64 & -1 & -1 & -1 & -1 & 12 & -1 & 84 & 56 & -1 & -1 & -1 & -1 & -1 & -1 & -1 & -1 & -1 & 0 & 0 & -1 & -1 \\
67 & 53 & -1 & -1 & -1 & 26 & -1 & -1 & 19 & -1 & -1 & -1 & -1 & -1 & -1 & -1 & -1 & -1 & -1 & -1 & -1 & 0 & 0 & -1 \\
-1 & -1 & -1 & 0 & 48 & -1 & -1 & -1 & 84 & 16 & -1 & -1 & -1 & -1 & -1 & -1 & -1 & -1 & -1 & -1 & -1 & -1 & 0 & 0 \\
7 & -1 & -1 & -1 & 76 & -1 & -1 & 25 & -1 & 35 & -1 & -1 & 95 & -1 & -1 & -1 & -1 & -1 & -1 & -1 & -1 & -1 & -1 & 0
\end{pmatrix}$$

FIG. 12

$$\begin{pmatrix}
23 & 68 & -1 & -1 & -1 & -1 & -1 & -1 & 7 & -1 & -1 & 10 & 95 & 0 & -1 & -1 & -1 & -1 & -1 & -1 & -1 & -1 & -1 & -1 \\
41 & 62 & 27 & -1 & -1 & -1 & -1 & -1 & 13 & -1 & -1 & -1 & -1 & 0 & 0 & -1 & -1 & -1 & -1 & -1 & -1 & -1 & -1 & -1 \\
-1 & -1 & 0 & -1 & -1 & -1 & -1 & 12 & -1 & 30 & 3 & -1 & -1 & -1 & 0 & 0 & -1 & -1 & -1 & -1 & -1 & -1 & -1 & -1 \\
88 & 50 & -1 & -1 & -1 & 77 & -1 & -1 & 34 & -1 & -1 & -1 & -1 & -1 & -1 & 0 & 0 & -1 & -1 & -1 & -1 & -1 & -1 & -1 \\
-1 & -1 & -1 & 38 & 21 & -1 & -1 & -1 & 46 & 85 & -1 & -1 & -1 & -1 & -1 & -1 & 0 & 0 & -1 & -1 & -1 & -1 & -1 & -1 \\
35 & -1 & -1 & -1 & 11 & -1 & -1 & 1 & -1 & 27 & -1 & -1 & -1 & -1 & -1 & -1 & -1 & 0 & 0 & -1 & -1 & -1 & -1 & -1 \\
-1 & -1 & -1 & 16 & -1 & 86 & 89 & -1 & -1 & 39 & -1 & -1 & -1 & -1 & -1 & -1 & -1 & -1 & 0 & 0 & -1 & -1 & -1 & -1 \\
-1 & -1 & -1 & -1 & 25 & 44 & -1 & -1 & -1 & 76 & 57 & -1 & 0 & -1 & -1 & -1 & -1 & -1 & -1 & 0 & 0 & -1 & -1 & -1 \\
-1 & -1 & -1 & 78 & -1 & 3 & 70 & -1 & -1 & -1 & -1 & 31 & -1 & -1 & -1 & -1 & -1 & -1 & -1 & -1 & 0 & 0 & -1 & -1 \\
-1 & -1 & -1 & 70 & 40 & -1 & 89 & -1 & -1 & -1 & -1 & 86 & -1 & -1 & -1 & -1 & -1 & -1 & -1 & -1 & -1 & 0 & 0 & -1 \\
-1 & -1 & 90 & -1 & -1 & -1 & 24 & 74 & -1 & -1 & 82 & -1 & -1 & -1 & -1 & -1 & -1 & -1 & -1 & -1 & -1 & -1 & 0 & 0 \\
-1 & 38 & 24 & -1 & -1 & 30 & -1 & -1 & -1 & -1 & -1 & 20 & 95 & -1 & -1 & -1 & -1 & -1 & -1 & -1 & -1 & -1 & -1 & 0
\end{pmatrix}$$

| | | | | | | | |
|---|---|---|---|---|---|---|---|
| -1 | -1 | # | -1 | -1 | # | -1 | -1 |
| -1 | -1 | # | -1 | -1 | -1 | -1 | # |
| -1 | -1 | -1 | -1 | # | -1 | -1 | # |
| -1 | # | -1 | -1 | # | -1 | -1 | -1 |
| -1 | # | -1 | -1 | -1 | -1 | # | -1 |
| -1 | -1 | -1 | # | -1 | -1 | # | -1 |
| # | -1 | -1 | # | -1 | -1 | -1 | -1 |
| # | -1 | # | -1 | -1 | # | -1 | -1 |
| -1 | # | -1 | # | -1 | # | -1 | # |
| # | -1 | # | -1 | # | -1 | # | -1 |
| -1 | # | -1 | # | -1 | # | -1 | # |
| # | -1 | # | -1 | # | -1 | # | -1 |
| -1 | # | -1 | # | -1 | # | -1 | # |
| # | -1 | # | -1 | # | -1 | # | -1 |
| -1 | # | -1 | # | -1 | # | -1 | # |
| # | -1 | # | -1 | # | -1 | # | -1 |
| -1 | # | -1 | # | -1 | # | -1 | # |
| # | -1 | # | -1 | # | -1 | # | -1 |
| -1 | # | -1 | # | -1 | # | -1 | # |
| # | -1 | # | -1 | # | -1 | # | -1 |
| -1 | # | -1 | # | -1 | # | -1 | # |
| # | -1 | # | -1 | # | -1 | # | -1 |
| -1 | # | -1 | # | -1 | # | -1 | # |
| # | -1 | # | -1 | # | -1 | # | -1 |

Layer_0, Layer_3, Layer_6, Layer_1, Layer_4, Layer_7, Layer_2, Layer_5

$$\begin{matrix}
[1] \\ [2] \\ [3] \\ [4] \\ [5] \\ [6] \\ [7] \\ [8]
\end{matrix}
\begin{bmatrix}
2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \\
-1 & 69 & -1 & 88 & -1 & 33 & -1 & 3 & -1 & 16 & -1 & 37 & -1 & 40 & -1 & 48 & -1 & 0 & 0 & -1 & -1 & -1 & -1 & -1 \\
10 & -1 & 86 & -1 & 62 & -1 & 28 & -1 & 85 & -1 & 16 & -1 & 34 & -1 & 73 & -1 & -1 & -1 & 0 & 0 & -1 & -1 & -1 & -1 \\
-1 & 28 & -1 & 32 & -1 & 81 & -1 & 27 & -1 & 88 & -1 & 5 & -1 & 56 & -1 & 37 & -1 & -1 & -1 & 0 & 0 & -1 & -1 & -1 \\
23 & -1 & 29 & -1 & 15 & -1 & 30 & -1 & 66 & -1 & 24 & -1 & 50 & -1 & 62 & -1 & -1 & -1 & -1 & -1 & 0 & 0 & -1 & -1 \\
-1 & 30 & -1 & 65 & -1 & 54 & -1 & 14 & -1 & 0 & -1 & 30 & -1 & 74 & -1 & 0 & -1 & -1 & -1 & -1 & -1 & 0 & 0 & -1 \\
32 & -1 & 0 & -1 & 15 & -1 & 56 & -1 & 85 & -1 & 5 & -1 & 6 & -1 & 52 & -1 & 0 & -1 & -1 & -1 & -1 & -1 & 0 & 0 \\
-1 & 0 & -1 & 47 & -1 & 13 & -1 & 61 & -1 & 84 & -1 & 55 & -1 & 78 & -1 & 41 & X & -1 & -1 & -1 & -1 & -1 & -1 & 0
\end{bmatrix}$$

FIG. 15

$$\begin{matrix}
[1] \\ [4] \\ [7] \\ [2] \\ [5] \\ [8] \\ [3] \\ [6]
\end{matrix}
\begin{bmatrix}
2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \\
-1 & 28 & -1 & 32 & -1 & 81 & -1 & 27 & -1 & 88 & -1 & 5 & -1 & 56 & -1 & 37 & -1 & -1 & -1 & 0 & 0 & -1 & -1 & -1 \\
32 & -1 & 0 & -1 & 15 & -1 & 56 & -1 & 85 & -1 & 5 & -1 & 6 & -1 & 52 & -1 & 0 & -1 & -1 & -1 & -1 & -1 & 0 & 0 \\
-1 & 69 & -1 & 88 & -1 & 33 & -1 & 3 & -1 & 16 & -1 & 37 & -1 & 40 & -1 & 48 & -1 & 0 & 0 & -1 & -1 & -1 & -1 & -1 \\
23 & -1 & 29 & -1 & 15 & -1 & 30 & -1 & 66 & -1 & 24 & -1 & 50 & -1 & 62 & -1 & -1 & -1 & -1 & -1 & 0 & 0 & -1 & -1 \\
-1 & 0 & -1 & 47 & -1 & 13 & -1 & 61 & -1 & 84 & -1 & 55 & -1 & 78 & -1 & 41 & X & -1 & -1 & -1 & -1 & -1 & -1 & 0 \\
10 & -1 & 86 & -1 & 62 & -1 & 28 & -1 & 85 & -1 & 16 & -1 & 34 & -1 & 73 & -1 & -1 & -1 & 0 & 0 & -1 & -1 & -1 & -1 \\
-1 & 30 & -1 & 65 & -1 & 54 & -1 & 14 & -1 & 0 & -1 & 30 & -1 & 74 & -1 & 0 & -1 & -1 & -1 & -1 & -1 & 0 & 0 & -1
\end{bmatrix}$$

$$[1] \quad \begin{vmatrix} 2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \end{vmatrix}$$

FIG. 17

| 1,1 | 1,2 | 1,3 | 1,4 |
| --- | --- | --- | --- |
| 2,1 | 2,2 | 2,3 | 2,4 |
| 3,1 | 3,2 | 3,3 | 3,4 |
| 4,1 | 4,2 | 4,3 | 4,4 |

FIG. 20A $$Q = \begin{pmatrix} \text{Layer0} \\ \text{Layer3} \\ \text{Layer6} \\ \text{Layer1} \\ \text{Layer4} \\ \text{Layer7} \\ \text{Layer2} \\ \text{Layer5} \end{pmatrix} \begin{pmatrix} 10.54 & 0 & 4.43 & 0 & 9.00 & 0 & 6.86 & 0 & 7.75 & 0 & 8.99 & 0 & 5.21 & 0 & 5.30 & 0 & 6.54 & 9.67 & 0 & 0 & 0 & 0 & 0 & 0 \\ 0 & 8.85 & 0 & 3.76 & 0 & 11.37 & 0 & 8.34 & 0 & 4.43 & 0 & 8.02 & 0 & 10.45 & 0 & 7.03 & 0 & 0 & 7.32 & 8.23 & 0 & 0 & 6.67 & 10.31 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 & 0 & \text{\#\#\#} & 0 & 0 & 9.08 & 0 & 0 & 0 \\ \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & 0 & 0 & \text{\#\#\#} & 0 & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & 0 & \text{\#\#\#} & 0 & 0 & 3.93 & 0 \\ \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & \text{\#\#\#} & 0 & 0 & \text{\#\#\#} & \text{\#\#\#} & 0 \end{pmatrix}$$

FIG. 20B $$R = \begin{array}{l}\text{Layer0}\\\text{Layer3}\\\text{Layer6}\\\text{Layer1}\\\text{Layer4}\\\text{Layer7}\\\text{Layer2}\\\text{Layer5}\end{array}\begin{pmatrix}3.67 & 0 & 4.29 & 0 & 3.67 & 0 & 3.70 & 0 & 3.68 & 0 & 3.67 & 0 & 3.90 & 0 & 3.88 & 0 & 3.72 & 3.67 & 0 & 0 & 0 & 0 & 0 & 0\\0 & 3.28 & 0 & 4.24 & 0 & 3.28 & 0 & 3.28 & 0 & 3.66 & 0 & 3.29 & 0 & 3.28 & 0 & 3.30 & 0 & 0 & 3.29 & 3.28 & 0 & 0 & 0 & 0\\0 & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\# & 0 & 0 & 0\\0 & 0 & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\# & 0 & 0\\0 & 0 & 0 & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\# & 0\\0 & 0 & 0 & 0 & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0 & \#\#\#\\0 & 0 & 0 & 0 & 0 & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0 & 0\\0 & 0 & 0 & 0 & 0 & 0 & 0 & \#\#\# & 0 & \#\#\# & 0 & \#\#\# & 0 & \#\#\# & 0 & \#\#\# & 0 & \#\#\# & 0 & \#\#\# & 0 & \#\#\# & 0 & 0\end{pmatrix}$$

FIG. 20C $$Q = \begin{pmatrix} 14.21 & 0 & 8.72 & 0 & 12.67 & 0 & 10.57 & 0 & 11.43 & 0 & 12.66 & 0 & 9.11 & 0 & 9.18 & 0 & 10.26 & 13.34 & 0 & 0 & 0 & 0 & 0 & 0 \\ 0 & 12.13 & 0 & 8.00 & 0 & 14.65 & 0 & 11.62 & 0 & 8.09 & 0 & 11.31 & 0 & 9.11 & 0 & 13.73 & 0 & 10.33 & 0 & 10.61 & 11.51 & 0 & 6.67 & 10.31 \\ 14.21 & 0 & 8.72 & 0 & 12.67 & 0 & 10.57 & 0 & 11.43 & 0 & 12.66 & 0 & 9.11 & 0 & 9.18 & 0 & 10.26 & 0 & 13.34 & 0 & 0 & 0 & 0 & 0 \\ 0 & 12.13 & 0 & 8.00 & 0 & 14.65 & 0 & 11.62 & 0 & 8.09 & 0 & 11.31 & 0 & 9.11 & 0 & 13.73 & 0 & 10.33 & 0 & 0 & 9.08 & 0 & 0 & 0 \\ \#\# & 0 & \#\# & 0 & \#\# & 0 & \#\# & 0 & \#\# & 0 & \#\# & 0 & \#\# & 0 & \#\# & 0 & \#\# & 0 & 13.34 & 0 & 0 & \#\# & 0 & 3.93 \\ 0 & \#\# & 0 & \#\# & 0 & \#\# & 0 & \#\# & 0 & \#\# & 0 & \#\# & 0 & \#\# & 0 & \#\# & 0 & \#\# & 0 & \#\# & 0 & 0 & 0 & 0 \\ \#\# & 0 & \#\# & 0 & \#\# & 0 & \#\# & 0 & \#\# & 0 & \#\# & 0 & \#\# & 0 & \#\# & 0 & \#\# & 0 & \#\# & 0 & \#\# & 0 & 0 \\ 0 & \#\# & 0 & \#\# & 0 & \#\# & 0 & \#\# & 0 & \#\# & 0 & \#\# & 0 & \#\# & 0 & \#\# & 0 & \#\# & 0 & \#\# & 0 & \#\# & \#\# & 0 \end{pmatrix}$$

Layer0
Layer3
Layer6
Layer1
Layer4
Layer7
Layer2
Layer5

FIG. 20D $$R = \begin{array}{l}\text{Layer0}\\\text{Layer3}\\\text{Layer6}\\\text{Layer1}\\\text{Layer4}\\\text{Layer7}\\\text{Layer2}\\\text{Layer5}\end{array}\begin{pmatrix} 3.67 & 0 & 4.29 & 0 & 3.67 & 0 & 3.70 & 0 & 3.68 & 0 & 3.67 & 0 & 3.90 & 0 & 3.88 & 0 & 3.67 & 0 & 3.72 & 3.67 & 0 & 0 & 0 & 0 \\ 0 & 3.28 & 0 & 4.24 & 0 & 3.28 & 0 & 3.28 & 0 & 3.66 & 0 & 3.29 & 0 & 3.28 & 0 & 3.30 & 0 & 6.36 & 0 & 0 & 3.29 & 3.28 & 0 & 0 \\ 6.34 & 0 & 6.44 & 0 & 6.35 & 0 & 6.36 & 0 & 6.35 & 0 & 6.35 & 0 & 6.41 & 0 & 6.40 & 0 & 6.36 & 0 & 7.15 & 0 & 0 & 0 & 7.62 & 6.36 \\ 0 & 7.11 & 0 & 7.64 & 0 & 7.11 & 0 & 7.11 & 0 & 7.12 & 0 & 7.58 & 0 & 7.12 & 0 & 7.11 & 0 & 7.15 & 0 & 7.11 & 0 & 7.26 & 0 & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & \text{\#\#\#} & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & 0 & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & \text{\#\#\#} & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & \text{\#\#\#} & \text{\#\#\#} \end{pmatrix}$$

FIG. 20E $$Q = \begin{pmatrix} \text{Layer0} \\ \text{Layer3} \\ \text{Layer6} \\ \text{Layer1} \\ \text{Layer4} \\ \text{Layer7} \\ \text{Layer2} \\ \text{Layer5} \end{pmatrix} \begin{pmatrix} 14.21 & 0 & 8.72 & 0 & 12.67 & 0 & 10.57 & 0 & 11.43 & 0 & 12.66 & 0 & 9.11 & 0 & 9.18 & 0 & 10.26 & 13.34 & 0 & 0 & 0 & 0 & 0 & 0 \\ 0 & 12.13 & 0 & 8.00 & 0 & 14.65 & 0 & 11.62 & 0 & 8.09 & 0 & 11.31 & 0 & 13.73 & 0 & 10.33 & 0 & 0 & 0 & 10.61 & 11.51 & 0 & 0 & 0 \\ 20.55 & 0 & 15.16 & 0 & 19.02 & 0 & 16.93 & 0 & 17.78 & 0 & 19.01 & 0 & 15.52 & 0 & 15.58 & 0 & 16.63 & 0 & 0 & 0 & 0 & 0 & 14.29 & 16.67 \\ 0 & 19.24 & 0 & 15.64 & 0 & 21.76 & 0 & 18.74 & 0 & 15.67 & 0 & 18.43 & 0 & 20.84 & 0 & 17.48 & 0 & 20.45 & 16.34 & 0 & 0 & 0 & 0 & 0 \\ 20.55 & 0 & 15.16 & 0 & 19.02 & 0 & 16.93 & 0 & 17.78 & 0 & 19.01 & 0 & 15.52 & 0 & 15.58 & 0 & 16.63 & 0 & 0 & 0 & 11.51 & 3.93 & 0 & 0 \\ 0 & 19.24 & 0 & 15.64 & 0 & 21.76 & 0 & 18.74 & 0 & 15.67 & 0 & 18.43 & 0 & 20.84 & 0 & 17.48 & 16.63 & 0 & 0 & 0 & 0 & 0 & 0 & 16.67 \\ \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & 0 & 0 & 0 & 0 & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 \end{pmatrix}$$

FIG. 20F $$R = \begin{pmatrix} \text{Layer0} \\ \text{Layer3} \\ \text{Layer6} \\ \text{Layer1} \\ \text{Layer4} \\ \text{Layer7} \\ \text{Layer2} \\ \text{Layer5} \end{pmatrix} \begin{pmatrix} 3.67 & 0 & 4.29 & 0 & 3.67 & 0 & 3.70 & 0 & 3.68 & 0 & 3.67 & 0 & 3.90 & 0 & 3.88 & 0 & 3.72 & 3.67 & 0 & 0 & 0 & 0 & 0 \\ 0 & 3.28 & 0 & 4.24 & 0 & 3.28 & 0 & 3.28 & 0 & 3.66 & 0 & 3.29 & 0 & 3.28 & 0 & 3.30 & 0 & 0 & 3.29 & 3.28 & 0 & 0 & 0 \\ 6.34 & 0 & 6.44 & 0 & 6.35 & 0 & 6.36 & 0 & 6.35 & 0 & 6.41 & 0 & 6.40 & 0 & 6.36 & 0 & 0 & 0 & 0 & 0 & 7.62 & 6.36 \\ 0 & 7.11 & 0 & 7.64 & 0 & 7.11 & 0 & 7.11 & 0 & 7.58 & 0 & 7.12 & 0 & 7.11 & 0 & 7.15 & 0 & 7.11 & 7.26 & 0 & 0 & 0 & 0 \\ 3.93 & 0 & 3.93 & 0 & 3.93 & 0 & 3.93 & 0 & 3.93 & 0 & 3.93 & 0 & 3.93 & 0 & 3.93 & 0 & 0 & 0 & 0 & 3.93 & 11.44 & 0 & 0 \\ 0 & 14.55 & 0 & 14.95 & 0 & 14.54 & 0 & 14.56 & 0 & 14.93 & 0 & 14.56 & 0 & 14.54 & 0 & 14.60 & 14.67 & 0 & 0 & 0 & 0 & 14.67 \\ \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & 0 & 0 & 0 & 0 & 0 & 0 \\ 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & 0 & \text{\#\#\#} & \text{\#\#\#} & 0 \end{pmatrix}$$

FIG. 20G $$Q = \begin{pmatrix} \text{Layer0} \\ \text{Layer3} \\ \text{Layer6} \\ \text{Layer1} \\ \text{Layer4} \\ \text{Layer7} \\ \text{Layer2} \\ \text{Layer5} \end{pmatrix} \begin{pmatrix} 14.21 & 0 & 8.72 & 0 & 12.67 & 0 & 10.57 & 0 & 11.43 & 0 & 12.66 & 0 & 9.11 & 0 & 10.26 & 13.34 & 0 & 0 & 0 & 0 & 0 \\ 0 & 12.13 & 0 & 8.00 & 0 & 14.65 & 0 & 11.62 & 0 & 8.09 & 0 & 11.31 & 0 & 13.73 & 0 & 10.33 & 0 & 0 & 10.61 & 11.51 & 0 & 0 \\ 20.55 & 0 & 15.16 & 0 & 19.02 & 0 & 16.93 & 0 & 17.78 & 0 & 19.01 & 0 & 15.52 & 0 & 15.58 & 0 & 16.63 & 0 & 0 & 0 & 14.29 & 16.67 \\ 0 & 19.24 & 0 & 15.64 & 0 & 22.94 & 0 & 19.45 & 0 & 15.67 & 0 & 18.43 & 0 & 20.84 & 0 & 17.48 & 0 & 20.45 & 16.34 & 0 & 0 & 0 \\ 24.48 & 0 & 19.09 & 0 & 22.95 & 0 & 20.86 & 0 & 21.71 & 0 & 22.94 & 0 & 19.45 & 0 & 19.51 & 0 & 0 & 0 & 0 & 15.44 & 15.37 & 0 \\ 0 & 33.79 & 0 & 30.59 & 0 & 36.30 & 0 & 33.30 & 0 & 30.60 & 0 & 32.99 & 0 & 35.38 & 0 & 32.08 & 31.30 & 0 & 0 & 0 & 0 & 31.34 \\ 24.48 & 0 & 19.09 & 0 & 22.95 & 0 & 20.86 & 0 & 21.71 & 0 & 22.94 & 0 & 19.45 & 0 & 19.51 & 0 & 0 & 0 & 16.34 & 16.61 & 0 & 0 \\ 0 & 33.79 & 0 & 30.59 & 0 & 36.30 & 0 & 33.30 & 0 & 30.60 & 0 & 32.99 & 0 & 35.38 & 0 & 32.08 & 0 & 0 & 0 & 0 & 15.37 & 14.29 \end{pmatrix}$$

FIG. 20H $$R = \begin{pmatrix} 3.67 & 0 & 4.29 & 0 & 3.67 & 0 & 3.70 & 0 & 3.68 & 0 & 3.67 & 0 & 3.90 & 0 & 3.88 & 0 & 3.72 & 3.67 & 0 & 0 & 0 & 0 \\ 0 & 3.28 & 0 & 4.24 & 0 & 3.28 & 0 & 3.28 & 0 & 3.66 & 0 & 3.28 & 0 & 3.29 & 0 & 3.28 & 0 & 0 & 3.29 & 3.28 & 0 & 0 \\ 6.34 & 0 & 6.44 & 0 & 6.35 & 0 & 6.36 & 0 & 6.36 & 0 & 6.35 & 0 & 6.41 & 0 & 6.40 & 0 & 6.36 & 0 & 0 & 0 & 7.62 & 6.36 \\ 0 & 7.11 & 0 & 7.64 & 0 & 7.11 & 0 & 7.12 & 0 & 7.58 & 0 & 7.12 & 0 & 7.11 & 0 & 7.15 & 0 & 7.11 & 7.26 & 0 & 0 & 0 \\ 3.92 & 0 & 3.92 & 0 & 3.92 & 0 & 3.92 & 0 & 3.92 & 0 & 3.92 & 0 & 3.92 & 0 & 3.92 & 0 & 3.92 & 0 & 0 & 3.93 & 8.23 & 0 \\ 0 & 14.55 & 0 & 14.95 & 0 & 14.54 & 0 & 14.56 & 0 & 14.93 & 0 & 14.56 & 0 & 14.54 & 0 & 14.60 & 14.67 & 0 & 0 & 0 & 0 & 14.67 \\ 7.16 & 0 & 7.16 & 0 & 7.16 & 0 & 7.16 & 0 & 7.16 & 0 & 7.16 & 0 & 7.16 & 0 & 7.16 & 0 & 0 & 0 & 7.32 & 9.08 & 0 & 0 \\ 0 & 14.00 & 0 & 14.00 & 0 & 14.00 & 0 & 14.00 & 0 & 14.00 & 0 & 14.00 & 0 & 14.00 & 0 & 14.00 & 0 & 14.00 & 0 & 0 & 14.29 & 15.37 & 0 \end{pmatrix}$$

Layer0, Layer3, Layer6, Layer1, Layer4, Layer7, Layer2, Layer5

FIG. 20I $$Q = \begin{pmatrix} \text{Layer0} \\ \text{Layer3} \\ \text{Layer6} \\ \text{Layer1} \\ \text{Layer4} \\ \text{Layer7} \\ \text{Layer2} \\ \text{Layer5} \end{pmatrix} \begin{pmatrix} 14.21 & 0 & 8.72 & 0 & 12.67 & 0 & 10.57 & 0 & 11.43 & 0 & 12.66 & 0 & 9.11 & 0 & 9.18 & 0 & 10.26 & 13.34 & 0 & 0 & 0 & 0 & 0 \\ 0 & 12.13 & 0 & 8.00 & 0 & 14.65 & 0 & 11.62 & 0 & 8.09 & 0 & 11.31 & 0 & 13.73 & 0 & 10.33 & 0 & 0 & 10.61 & 11.51 & 0 & 0 & 0 \\ 20.55 & 0 & 15.16 & 0 & 19.02 & 0 & 16.93 & 0 & 17.78 & 0 & 19.01 & 0 & 15.52 & 0 & 15.58 & 0 & 16.63 & 0 & 0 & 0 & 0 & 14.29 & 16.67 \\ 0 & 19.24 & 0 & 15.64 & 0 & 22.94 & 0 & 19.45 & 0 & 15.67 & 0 & 18.43 & 0 & 20.84 & 0 & 17.48 & 0 & 20.45 & 16.34 & 0 & 0 & 0 & 0 \\ 24.48 & 0 & 19.09 & 0 & 22.95 & 0 & 20.86 & 0 & 21.71 & 0 & 22.94 & 0 & 19.45 & 0 & 19.51 & 0 & 0 & 0 & 0 & 0 & 15.44 & 15.37 & 0 \\ 0 & 33.79 & 0 & 30.59 & 0 & 36.30 & 0 & 33.30 & 0 & 30.60 & 0 & 32.99 & 0 & 35.38 & 0 & 32.08 & 31.30 & 0 & 0 & 0 & 0 & 0 & 31.34 \\ 31.63 & 0 & 26.24 & 0 & 30.10 & 0 & 28.01 & 0 & 28.86 & 0 & 30.09 & 0 & 26.60 & 0 & 26.66 & 0 & 0 & 0 & 16.40 & 16.40 & 0 & 0 & 0 \\ 0 & 47.79 & 0 & 44.59 & 0 & 50.30 & 0 & 47.30 & 0 & 44.60 & 0 & 46.99 & 0 & 49.38 & 0 & 46.08 & 0 & 0 & 0 & 0 & 29.66 & 29.66 & 0 \end{pmatrix}$$

APPARATUS AND METHOD FOR DECODING USING CHANNEL CODE

CROSS-REFERENCE TO RELATED APPLICATIONS

This application is the National Stage filing under 35 U.S.C 371 of International Application No. PCT/KR05/04466, filed on Dec. 22, 2005, which claims the benefit of earlier filing date and right of priority to Korean Application No. 10-2004-0110678, filed on Dec. 22, 2004, to Korean Application No. 10-2005-0003296, filed on Jan. 13, 2005, and to Korean Application 10-2005-0101898, filed on Oct. 27, 2005.

TECHNICAL FIELD

The present invention relates to an encoding and decoding method, and more particularly, to an encoding and decoding method and apparatus using Low Density Parity Check (LDPC) codes, which can improve encoding and decoding performance without using a large memory capacity and also can reduce the complexity of hardware for implementation.

BACKGROUND ART

Recently, an encoding method using LDPC codes has attracted lots of attention. In 1962, Gallager has suggested LDPC codes as low-density linear block codes since most elements of a parity check matrix H are zero. LDPC codes were forgotten since the LDPC codes are very complicated so that they could not be realized with technologies of that time. In 1995, LDPC codes were recognized again and excellent performance thereof was validated. Recently, intensive studies have been done on LDPC codes (see: [1] Robert G. Gallager, "Low-Density Parity-Check Codes", The MIT Press, Sep. 15, 1963, and [2] D. J. C. Mackay, Good error-correcting codes based on very sparse matrices, IEEE Trans. Inform. Theory, IT-45, pp. 399-431 (1999)).

Since the number of 1s in a parity check matrix of an LDPC code is very small, the parity check matrix allows decoding even for a very large block size through iterative decoding. Thus, as the block size increases, the performance of the parity check matrix of an LDPC code approaches Shannon's channel capacity limit as that of a turbo code. The number of 1s included in a row or column of the parity check matrix is referred to as a weight.

An LDPC code can be described using an (n–k)×n parity check matrix H. A generator matrix G corresponding to the parity check matrix H can be obtained by Equation 1.

$$H \cdot G = 0 \qquad \text{[Equation 1]}$$

In an encoding and decoding method using LDPC codes, the transmitting side can encode input data according to Equation 2 using the generator matrix G that has the relationship of Equation 1 with the parity check matrix.

$$c = G \cdot x, \qquad \text{[Equation 2]}$$

where "c" denotes a codeword and "x" denotes information bits.

A description will now be given of a conventional decoding method using the H matrix.

A decoder at the receiving side must obtain information bits x from a codeword c that is an encoding result at the transmitting side. The decoder determines the information bits x using a condition "Hc=0". Specifically, when a codeword c' is received, the value of Hc' is calculated. If the value of Hc' is 0, it is determined that first k bits of the codeword c' are decoded information bits. If the value of Hc' is not 0, the information bits x are reconstructed by finding a codeword c', which satisfies a check equation "Hc'=0", using a graph-based sum-product algorithm, a belief propagation algorithm, or the like. The check equation "Hc'=0" can be changed to "c'H$^T$=0" according to the information bits and the G matrix. Thus, the check equation can be changed according to the relationship between the information bits and the G matrix.

FIG. 1 illustrates a bipartite graph that expresses a parity check matrix H. In FIG. 1, "CNU" stands for a check node unit and "VNU" stands for a variable (or bit) node unit. A decoding procedure that is performed by applying an algorithm to the bipartite graph can be divided into the following three main processes.

1. Check-to-variable node likelihood value update.
2. Variable-to-check node likelihood value update.
3. Determination of decoded value based on variable (or bit) node likelihood.

Likelihood values received over a channel are input at an initialization step, and then the first process is performed to update the check nodes. After the first process is completed, the second process is carried out to perform the variable-to-check node likelihood value update. After the first and second processes are completed, a decoded value is determined using the likelihood values received over the channel and the likelihood values updated through the first and second processes.

In the decoding procedure, if the determined decoded value c' satisfies a check equation "Hc'=0" at the third process after the first and second processes are completed, the value c' is determined to be a correctly received decoded value, otherwise, the first and second processes are iterated up to a specific number of times until the check equation is satisfied. The likelihood value update processes of the first and second processes are iterated the same number of times as the number of nonzero elements (i.e., the number of 1s) included in each row or column of the parity check matrix. That is, the check-to-variable update of the first process and the variable-to-check update of the second process are performed on positions of the parity check matrix H that correspond to weights thereof. As the first and second processes are iterated, the reliability of the likelihood values of the check and variable nodes increases, thereby approaching a true value of the codeword to be obtained.

Recent LDPC encoding methods generally encode data using the parity check matrix H rather than the generator matrix G. Thus, as described above, the parity check matrix H can be considered the most important element of the encoding method using LDPC codes. Since the parity check matrix H has a size of about 1000×2000 or more, it requires a number of calculations in the encoding and decoding processes, complicates the implementation, and requires a large storage space.

DISCLOSURE OF INVENTION

In one aspect of the present invention, provided herein is a decoding method that comprises receiving a signal encoded using a parity check matrix from a transmitting side; and decoding the received signal using the parity check matrix, wherein the parity check matrix includes a plurality of layers and nonzero elements of the layers do not overlap in column direction, and wherein each of the layers includes at least one row.

In another aspect of the present invention, provided herein is a decoding method that comprises receiving a signal encoded using a parity check matrix; and decoding the received signal using a parity check matrix in units of a specific number of layers that do not overlap, the parity check matrix including a plurality of layers whose nonzero elements do not overlap in column direction, wherein each of the layers includes at least one row.

In a further aspect of the present invention, provided herein is a decoding apparatus that comprises a receiver module that receives a signal encoded using a parity check matrix; a memory that stores information of a parity check matrix that includes a plurality of layers whose nonzero elements do not overlap in column direction; and a decoding module that decodes the received signal using the information of the parity check matrix obtained from the memory in units of a specific number of layers that do not overlap, wherein each of the layers includes at least one row.

BRIEF DESCRIPTION OF DRAWINGS

In the drawings:

FIG. 3 illustrates a base matrix that includes a number of permutation matrices or a zero matrix of dimension z×z.

FIG. 4 illustrates how each row (or column) of a base permutation matrix is shifted by a specific number of rows (or columns) according to the present invention.

Figure 5B:
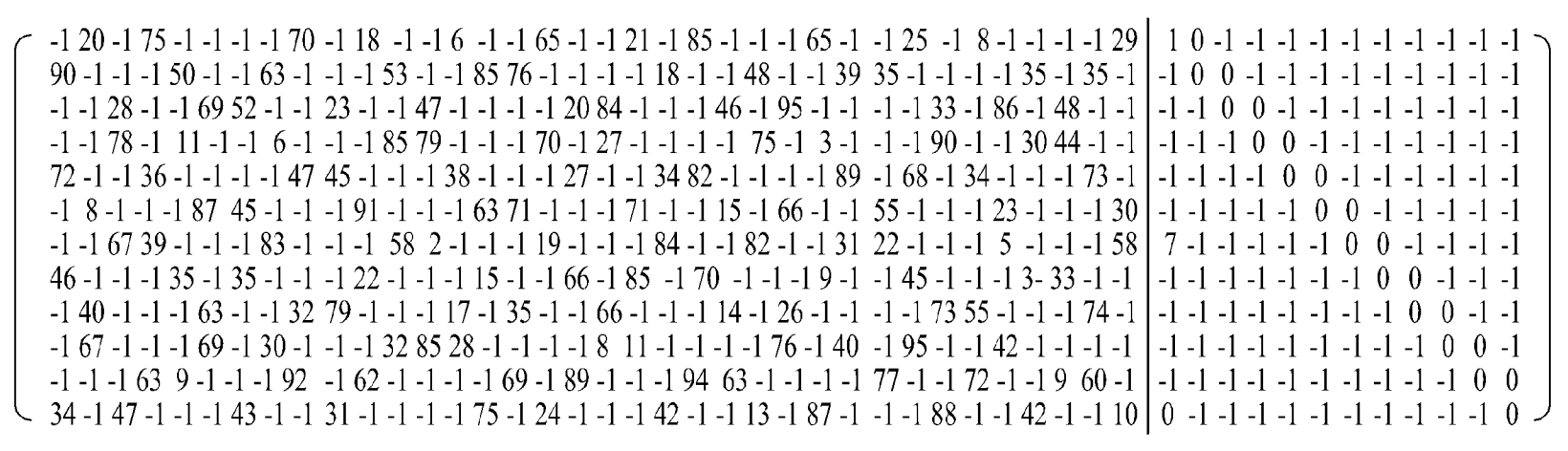

FIGS. 5A-5F illustrate base matrices according to an embodiment of the present invention.

FIG. 6 illustrates a base matrix for a code rate of ½ that is formed by shortening the size of a base matrix for a code rate of ¾.

FIG. 7 illustrates another base matrix according to the embodiment of the present invention.

FIG. 8 illustrates another example of the base matrix when the code rate is ¾.

FIG. 9 illustrates an example of a parity check matrix that is divided into layers.

FIG. 10B illustrates how the parallel processing causes a memory collision.

FIG. 11 illustrates another embodiment of a base matrix when the code rate is ½.

FIG. 12 illustrates another embodiment of the base matrix when the code rate is ½.

FIGS. 13A-13D illustrate an example of a parity check matrix that can be processed in parallel according to the present invention.

FIG. 14 illustrates another embodiment of the base matrix when the code rate is ⅔.

FIG. 15 illustrates a base matrix obtained by permuting rows of the base matrix suggested in the present invention.

FIG. 17 illustrates a memory structure of the LDPC decoder according to the embodiment of the present invention.

FIGS. 20A-20I illustrate one iteration of a decoding procedure, starting from an initialization step, when LDPC decoding is performed in a parallel processing fashion.

BEST MODE FOR CARRYING OUT THE INVENTION

Figure 1:
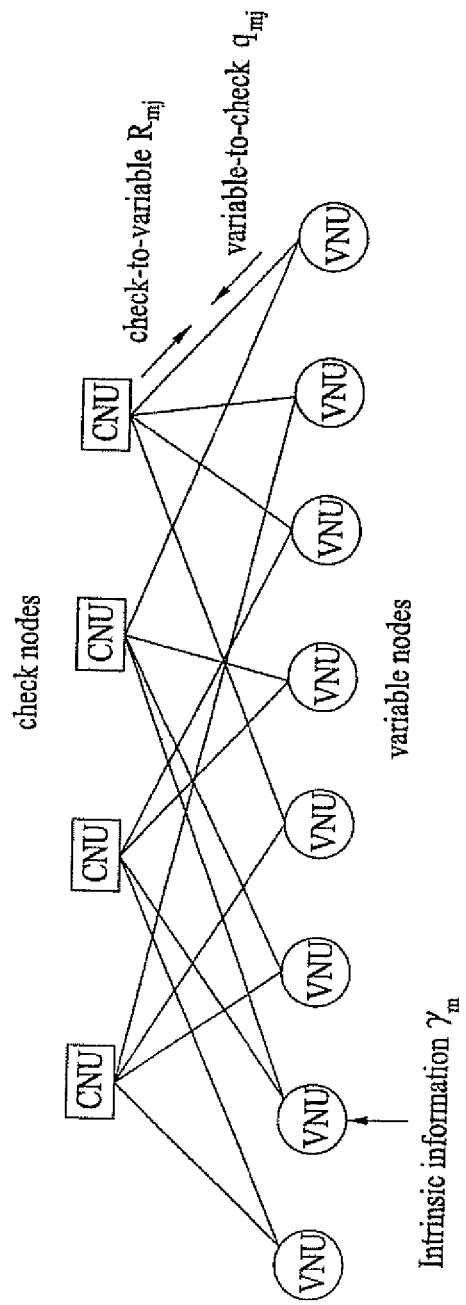
FIG. 1 illustrates a bipartite graph that expresses a parity check matrix H.
Figure 2A:
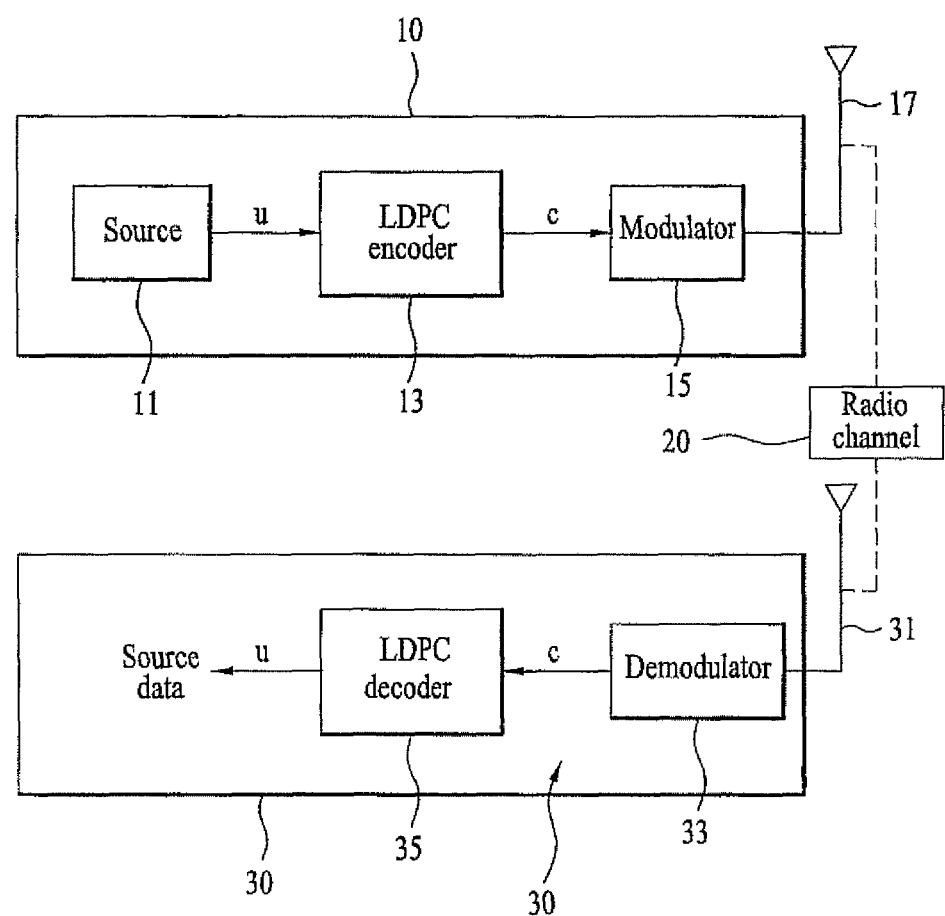
FIG. 2A illustrates an example of a wireless communication system to which the technical features of the present invention are applied.

Preferred embodiments of an encoding method using Low Density Parity Check (LDPC) codes according to the present invention will now be described with reference to the accompanying drawings. FIG. 2A is a drawing for explaining a preferred embodiment of the present invention. This figure shows an example of a wireless communication system to which technical features of the present invention are applied. The embodiments described below are just examples illustrating the features of the present invention and it will be apparent to those skilled in the art that the technical features of the present invention can be applied to all fields that require encoding.

In FIG. 2A, a transmitter 10 performs communication with a receiver 30 through a wireless channel 20. In the transmitter 10, k-bit source data "u" output from a data source 11 is LDPC-encoded into an n-bit codeword "c" through an LDPC encoder 13. The codeword "c" is modulated into wireless data through a modulator 15, and the wireless data is transmitted through an antenna 17. The receiver 30 receives the wireless data over the wireless channel 20 through an antenna 31. The received data is then subjected to the inverse of the procedure performed in the transmitter 10. Specifically, the received data is demodulated through a demodulator 33 and is then LDPC-decoded into source data "u" through an LDPC decoder 35. The transmission and reception procedures have been described only to the extent required to explain the features of the present invention, and it will be apparent to those skilled in the art that a variety of processes other than those described above are necessary for data transmission.

The parity check matrix "H", which the LDPC encoder 13 uses to encode the input source data, has a dimension of (n−k)×n. Here, "k" denotes the length (in bits) of the source data input to the LDPC encoder 13 and "n" denotes the length (in bits) of the encoded codeword "c". As shown in FIG. 3, the parity check matrix "H" includes a plurality of permutation matrices or a zero matrix of dimension z×z. That is, "$P_{i,j}$" in FIG. 3 denotes a permutation or zero matrix of dimension z×z.

The plurality of permutation matrices are formed by changing at least one base permutation matrix according to a specific rule. The base permutation matrix is preferably an identity matrix. The weight of each row and column the plurality of permutation matrices is preferably "1". In other words, preferably, only one element of each row of the plurality of permutation matrices and only one element of each column thereof are "1" and the other elements are all "0".

Figure 4:
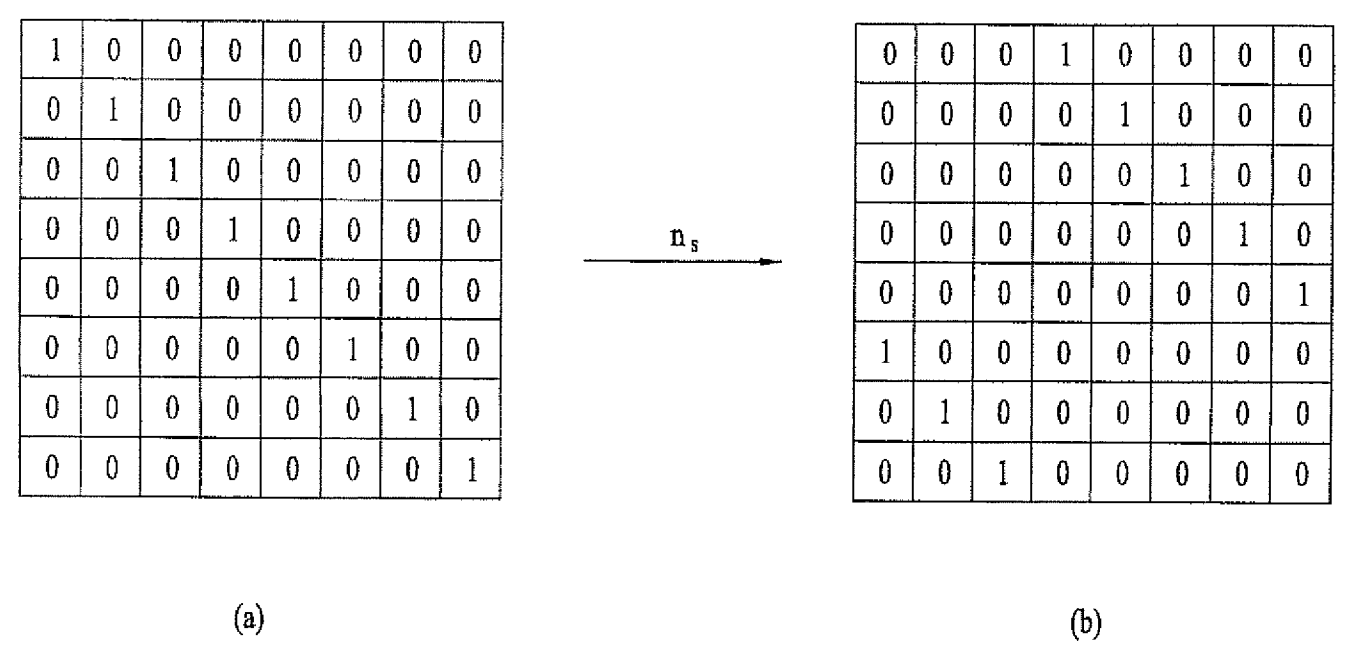

In the preferred embodiment, the method of changing the at least one base permutation matrix according to the specific rule to form the plurality of permutation matrices may include a method in which each row (or column) of the base permutation matrix is shifted by a specific number of rows (or columns). FIG. 4 illustrates an example of this method. In this example, a permutation matrix of FIG. 4(b) is formed by shifting each row of a base permutation matrix of FIG. 4(a) downwards by 5 rows (i.e., $n_s$=5) (or by shifting each column to the right by 3 columns). In this method, z−1 number of permutation matrices can be formed by shifting a base permutation matrix of dimension z×z by different rows (or columns), thus forming a total of z number of permutation matrices including the base permutation matrix. Given the base permutation matrix, each of the z number of permutation matrices including the base permutation matrix can be expressed by a single integer. For example, each of the permutation matrices can be expressed by a single integer in such a manner that the base permutation matrix is expressed by "0", a permutation matrix obtained by shifting each row of the base permutation matrix by one row is expressed by "1", a permutation matrix obtained by shifting each row of the base permutation matrix by two rows is expressed by "2", and so on.

As described above, the type of each of the plurality of permutation matrices formed from the base permutation matrix can be expressed simply by a single integer according to the number of shifted rows (or columns). The method of expressing the type of plurality of permutation matrices by a single integer is only illustrative and, of course, each of the permutation matrices may be expressed by other methods.

Figure 2B:
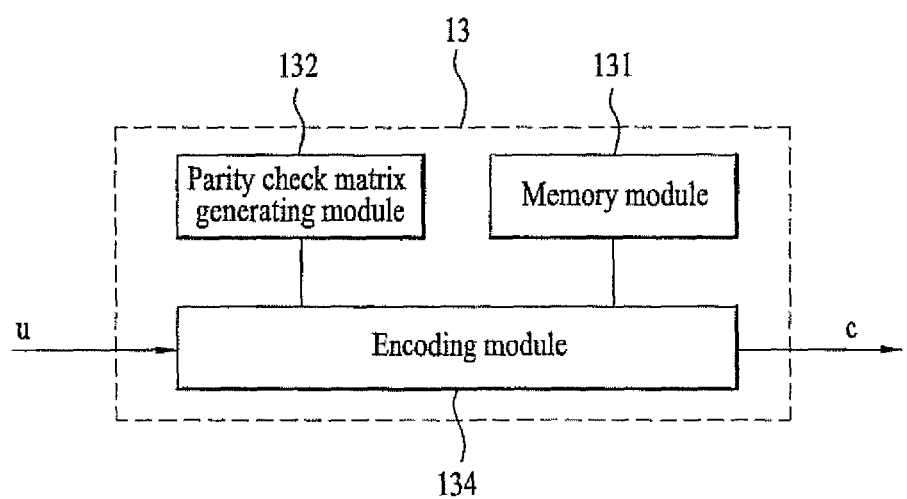
FIG. 2B illustrates an example of an encoding device to which the technical features of the present invention are applied.

One feature of the embodiment is that encoding or decoding is performed using a parity check matrix H in such a manner that the types of at least one base permutation matrix and a plurality of permutation matrices formed by shifting each row (or column) of the at least one base permutation matrix by a specific number of rows (or columns) are recorded in a base matrix $H_b$, and then, each time encoding or decoding is needed at the transmitting or receiving side, a parity check matrix H is generated using the at least one base permutation matrix and the base matrix $H_b$, and encoding or decoding is performed using the generated parity check matrix. In FIG. 2B, a preferred embodiment of the encoder using LDPC codes according to the present invention includes a memory module 131, a parity check matrix generation module 132, and an encoding module 134. The memory module 131 stores the base permutation matrix and the base matrix. The parity check matrix generation module 132 generates the parity check matrix using the base permutation matrix and the base matrix stored in the memory module 131. The encoding module 134 encodes input source data using the parity check matrix generated by the parity check matrix generation module 132. It will be apparent to those skilled in the art that the parity check matrix generation module 132 and the encoding module 134 can be implemented in software or hardware according to their functions.

When the base matrix $H_b$ is considered as having a form of $[H_d|H_p]$ that is divided into two parts $H_d$ and $H_p$, it is desirable that a block dual diagonal matrix be used for the $H_p$ part. However, the present invention is not limited to this matrix form. The block dual diagonal matrix is a matrix where all elements of a diagonal immediately below or above the main diagonal are identity matrices and the remaining elements are zero matrices. When the $H_p$ part is in the form of a block dual diagonal matrix, the $H_p$ part has a column of weight 1. To avoid this, it is preferable that one or two of the zero matrices be replaced with identity matrices.

The $H_d$ part of the base matrix $H_b$ is formed by combining a base permutation matrix, a plurality of permutation matrices, each of which is formed by shifting each row of the base permutation matrix by a specific number of rows, and a zero matrix. In terms of encoding or decoding performance, it is preferable that the following requirements be considered when forming the base matrix $H_b$ by combining the three types of matrices.

First, the difference between the numbers of permutation matrices of any two types of the plurality of permutation matrices in the base matrix $H_b$ should be a first threshold or less. In other words, it is preferable that the total number of permutation matrices of each type in the base matrix $H_b$ be equal or similar. The less the first threshold is, the more preferable it is. However, values of the first threshold in the range of 3 to 7 are allowable.

Second, it is preferable that no 4-cycle or 6-cycle be present in the parity-check matrix H or the number of 4-cycles or 6-cycles in the parity check matrix H be minimized. Particularly, it is preferable that the parity check matrix H have no 4-cycle. It is also preferable that the parity check matrix H have a smaller number of 6-cycles than a preset second threshold $C_{max}$. The 4-cycle indicates that two arbitrary rows of the parity check matrix H have "1" at two positions. The 6-cycle indicates that any pair of rows selected from three arbitrary rows of the parity check matrix H have "1" at the same position.

Third, all column weights and/or all row weights of the parity check matrix H should have regularity. Using a z×z identity matrix as the base permutation matrix makes it possible to give regularity to all row weights and/or all column weights of the parity check matrix H.

Fourth, the three types of matrices must be combined to form the base matrix $H_b$ so that high encoding and decoding performance is achieved for all code rates and all codeword sizes. Since variable code rates and variable code sizes are applied to recent mobile communication systems, the base matrix $H_b$ must be optimized to achieve high performance for all code rates and all codeword sizes when forming the base matrix $H_b$ by combining the base permutation matrix, the plurality of permutation matrices, each of which is formed by shifting each row of the base permutation matrix by a specific number of rows, and the zero matrix.

FIGS. 5A-5F illustrate preferred examples of the base matrix $H_b$ that has the characteristics as described above. The examples shown in FIGS. 5A to 5F are base matrices when the code rate is ¾, where "0" denotes an identity matrix of z×z dimension, "−1" denotes a zero matrix, and "integer equal to or greater than 1" denotes a permutation matrix formed by shifting each row of the identity matrix of z×z dimension by the same number of rows as the integer.

As shown in FIG. 6, a base matrix $H_b$ when the code rate is ½ can be formed by shortening the size of the base matrix when the code rate is ¾.

FIG. 7 illustrates another example of the base matrix $H_b$ that has the characteristics as described above. The example shown in FIG. 7 is a base matrix when the code rate is ⅔, where "0", "−1", and "integer equal to or greater than 1" denote the same as in FIGS. 5A-5F.

The dimension "z" of the base permutation matrix must vary as the codeword length varies. In terms of saving memory resources, it is not desirable that base matrices be formed for all dimensions of base permutation matrices and all the base matrices be stored and used for encoding. Thus, it is preferable that only a first base matrix for a first base permutation matrix having the maximum dimension $z_{max}$ be stored and a base matrix for a second base permutation matrix having a different dimension z be generated using the first base matrix each time it is needed for encoding or decoding.

In this case, the first base matrix may have two or more types of permutation matrices as its elements. Specifically, the entire range of the varying dimension z of the base permutation matrix is divided into two or more ranges, and a permutation matrix type optimized for each of the ranges is set. For example, when the entire range of the varying dimension z is 10 to 96, the entire range is divided into a range of 10 to 53 and a range of 54 to 96 and a first base matrix optimized for each of the ranges is formed. The two first base matrices formed in this manner are not separately stored. Instead, the two types of values are stored as each element of a single first base matrix, thereby increasing encoding or decoding performance and also saving memory resources.

FIG. 8 illustrates another example of the base matrix where the code rate is ¾. The base matrix shown in FIG. 8 is characterized in that the number of 4-cycles and 6-cycles is minimized, regularity is given to each column weight, and each element of the base matrix is obtained by shifting the base permutation matrix so as to achieve high performance in terms of all code rates and all codeword sizes. Simulation results are that the example of FIG. 8 exhibited almost the same performance as the examples of FIGS. 5A-5F although the size of the example of FIG. 8 was reduced to a quarter of the size of those of FIGS. 5A-5F.

A method for decoding an LDPC code using the parity check matrix H generated from the base matrix $H_b$ described above will now be described. The conventional method for decoding LDPC codes is typically performed by iterating a likelihood value update procedure between check and variable nodes on a bipartite graph, which is a different expression of the parity check matrix H, to improve the reliability of the likelihood values. The method of decoding LDPC codes using the bipartite graph, which is another expression of the parity check matrix H, determines a codeword based on the updated likelihood values. Therefore, the likelihood value update procedure has a direct influence on the performance of the decoder.

The reliability update procedure can be considered as being mainly divided into a check-to-variable node likelihood value update process and a binary-to-check node likelihood value update process. When the check-to-variable node likelihood update is performed, the likelihood value of a given element of the parity check matrix H is updated using likelihood values of other elements in the same row. Moreover, when the variable-to-check node likelihood update is performed, the likelihood value of a given element of the parity check matrix H is updated using likelihood values of other elements in the same column.

The greater the number of times the likelihood values have been updated, the more reliable results (i.e., the more positive effects) the decoder decodes.

A description will now be given of a method for decoding LDPC codes, which exerts more positive effects on the decoder. In an embodiment of the present invention, when a LDPC-encoded received signal, is decoded using the parity check matrix H, the decoding is performed based on a method (hereinafter, referred to as "layered decoding") in which the received signal is decoded in units of layers, each of which is a group of rows of the parity check matrix H. The layered decoding is characterized in that, if an already updated value is present in the same column as a given element supposed to be updated, when a variable-to-check node likelihood value update is performed, the likelihood value of the given element is updated using the already updated value.

The layered decoding is a method in which the rows of the parity check matrix H in encoding and decoding LDPC codes are divided into a plurality of layers and decoding is iterated for each of the layers. Specifically, when the rows of the parity check matrix H are divided into several groups, each of the groups can be considered as a layer. The layer may also be a single row.

FIG. 9 illustrates a base matrix that is divided into layers. The illustrated base matrix is an example for explaining the layered decoding method. Numbers shown in FIG. 9 are shift numbers that indicate the types of a plurality of permutation matrices formed from the base permutation matrix.

In the layered decoding, reliability update of the same row of the parity check matrix H is performed using likelihood values that have all been subjected to an update procedure of the same level. Specifically, in the layered decoding, check-to-variable node likelihood value update procedure is performed as in the conventional LDPC decoding method. However, the layered decoding is characterized in that the likelihood values are updated on a layer basis in the variable-to-check node likelihood value update procedure (i.e., the procedure for updating likelihood values of a column of the parity check matrix H), and likelihood values included in a specific layer are updated using likelihood values included in an already updated layer. The layered decoding is performed on a layer basis, and, when likelihood values of all layers included in the parity check matrix H have been updated, it is considered that one iteration of the LDPC decoding is completed. More specifically, in the layered decoding method, when calculation for updating likelihood values of a given layer is performed and calculation for updating likelihood values of a next layer is then performed, the calculation results of the given layer (i.e., result messages with updated reliabilities) are used for the calculation of the next layer, which allows more reliable messages (i.e., more updated likelihood values) to be used for the decoding procedure (i.e., the likelihood value update procedure). Repeating this likelihood value update procedure ensures that more reliable messages are used for the decoding procedure. This increases the reliability of likelihood values between check and variable nodes, thereby improving the performance of the decoder. The matrix of FIG. 9 is a general base matrix. The layers of the matrix of FIG. 9 can be sequentially decoded according to the layered decoding method, for example, in the order of Layer 1->Layer 2->Layer 3->Layer 4->Layer 5->Layer 6->Layer 7->Layer 8.

A description will now be given of the basic concept of parallel processing employed in the present invention and prerequisites for performing the layered decoding in a parallel processing fashion.

Figure 10A:
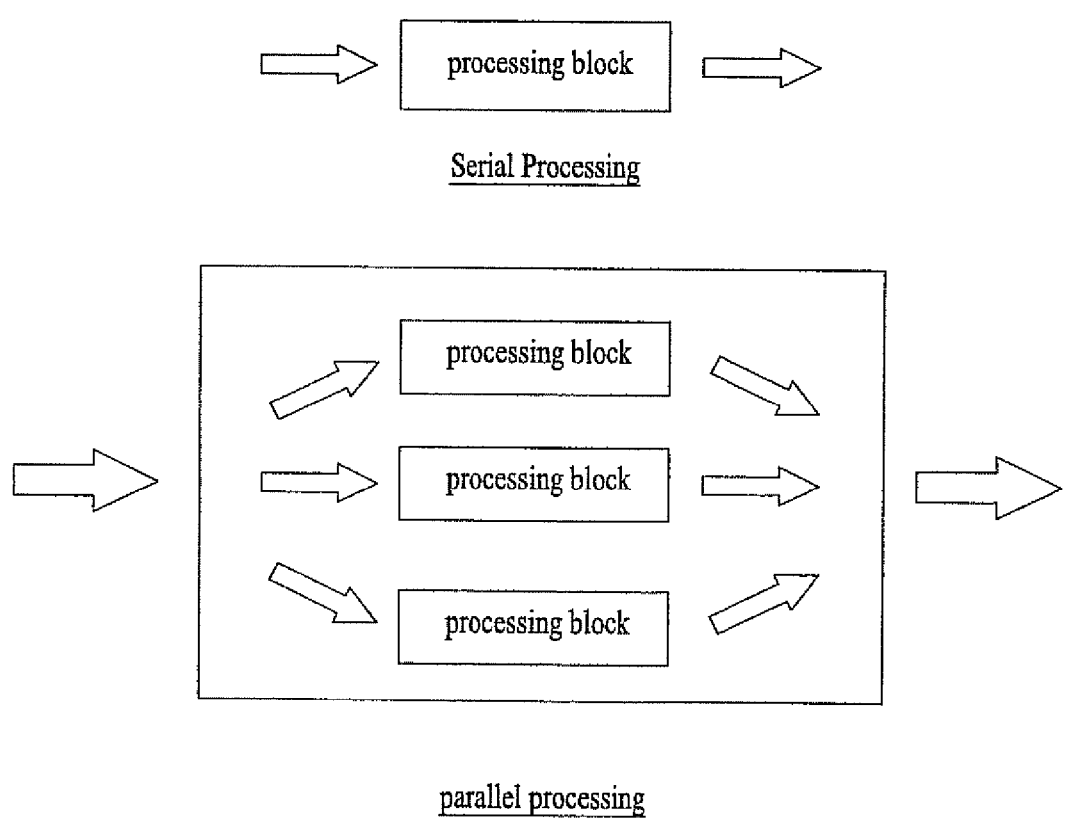
FIG. 10A illustrates the concept of parallel processing.

FIG. 10A illustrates the concept of parallel processing. The parallel processing is a method in which a single task, which was being processed by a single unit, is processed in parallel by a plurality of processing units. The parallel processing has an advantage in that the time required to perform a single process is reduced in proportion to the number of processing blocks used for the parallel processing. However, the parallel processing causes problems such as memory collisions and dependency between data processed in parallel. These problems must be solved to perform the layered decoding in a parallel processing fashion according to the present invention.

A description will now be given of such problems caused by the parallel processing for layered decoding and solutions to the problems according to the present invention.

FIG. 10B illustrates how the parallel processing causes a memory collision. The serial processing method causes no problem with reading values to be processed or storing processing results since the memory block is used by a single processing unit. However, in the parallel processing method in which a number of processing units are operated at the same time, a memory collision may occur when two or more processing units simultaneously access the same memory position. For example, a memory collision may occur when units for updating likelihood values for the LDPC decoding simultaneously access the same memory position.

To apply the parallel processing method to the LDPC decoding, it is necessary to avoid not only the problem with simultaneous access to the memory block but also the dependency between data to be processed simultaneously. That is, when it is necessary that a value output from one of a plurality of processing blocks be input to another processing block at the same time, the values must be processed sequentially according to the dependency between the values instead of processing them simultaneously.

An embodiment of the LDPC decoding method according to the present invention is characterized in that, while the parity check matrix H is divided into layers and the layers are sequentially processed in a specific order, specific ones of the layers are decoded in a parallel processing fashion without causing the problems such as the memory collision and the dependency between data to be processed in parallel. The embodiment of the present invention provides a parity check matrix H with no overlap between the specific layers in order to allow data of the specific layers to be processed in parallel. Specifically, in the parity check matrix H according to the embodiment of the present invention, nonzero elements of the specific layers in the parity check matrix H are located at different positions in column direction. In other words, positions in the specific layers of the parity check matrix, where weights are present, are different in column direction.

As described above, in the conventional method for decoding LDPC codes, likelihood values of all rows of an H matrix are updated and likelihood values of all columns of the H matrix are then updated. On the other hand, in the layered decoding method, likelihood values of the rows of an H matrix are updated in units of previously divided groups of rows (layers). This decoding method uses more reliable likelihood values of a previous group, which have already been updated, for calculation for updating likelihood values of second and subsequent groups, thereby improving decoding performance. Despite this advantage, the layered decoding method may cause decoding delay due to having to process only one layer at a time to avoid the problems such as memory collisions and dependency between data to be processed in parallel in specific layers, which are caused by dividing the conventional parity check matrix into the specific layers and processing data of the specific layers in parallel as described above. However, it the parity check matrix is designed so that positions in the specific layers where column weights are present do not overlap as is suggested in the embodiment of the present invention, a number of layers can be processed simultaneously and in parallel.

A description will now be given of how layered decoding is performed in a parallel processing fashion on specific layers using a parity check matrix with no overlap between the specific layers.

FIG. 11 illustrates another embodiment of the base matrix when the code rate is ½. In this embodiment, rows of a parity check matrix H generated using a base matrix of FIG. 11 are grouped into layers, each layer including rows corresponding to the size of the base permutation matrix of the base matrix. Specifically, in this embodiment, a layer in the parity check matrix H generated using the base permutation matrix and the base matrix of FIG. 11 includes the same number of rows as the number of rows of the base permutation matrix. Thus, the number of rows included in a single layer in the base matrix of FIG. 11 is equal to the number of rows of a base permutation matrix of the base matrix of FIG. 11. The base matrix of FIG. 11 is suggested for efficient parallel processing. When the row order of the base matrix is adjusted to "1→7→2→4→8→3→9→4→10→5→11→6→12" in the layered decoding, nonzero elements (for example, 1st and 7th rows) of any two adjacent rows of the base matrix do not overlap in column direction. In other words, elements having shift numbers greater than "0" of any two adjacent rows (for example, 1st and 7th rows) in the base matrix do not overlap in column direction. For example, as can be seen from FIG. 11, elements having shift numbers greater than "0" of the eighth row do not overlap in any column with those of the second or third row. A single row of the base matrix of FIG. 11 corresponds to a single layer of the parity check matrix generated using the base matrix of FIG. 11, and positions in the layers of the generated parity check matrix H, where weights are present, do not overlap in column direction.

FIG. 12 illustrates another embodiment of the base matrix when the code rate is ½. The base matrix of FIG. 12 is suggested for more efficient parallel processing. The base matrix of FIG. 12 is designed so that elements having shift numbers greater than "0" in two rows of any one of pairs of rows (1, 7), (2, 8), (3, 9), (4, 10), (5, 11), and (6, 12) do not overlap in any column. The embodiments of FIGS. 11 and 12 are characterized by achieving efficient parallel processing in an implementation procedure for the layered decoding.

A description will now be given of how the order of layers of a base matrix is adjusted so that there is no overlap between specific layers and layered decoding is then performed in a parallel processing fashion using a parity check matrix generated using the adjusted base matrix according to another embodiment of the present invention.

Figure 13A:
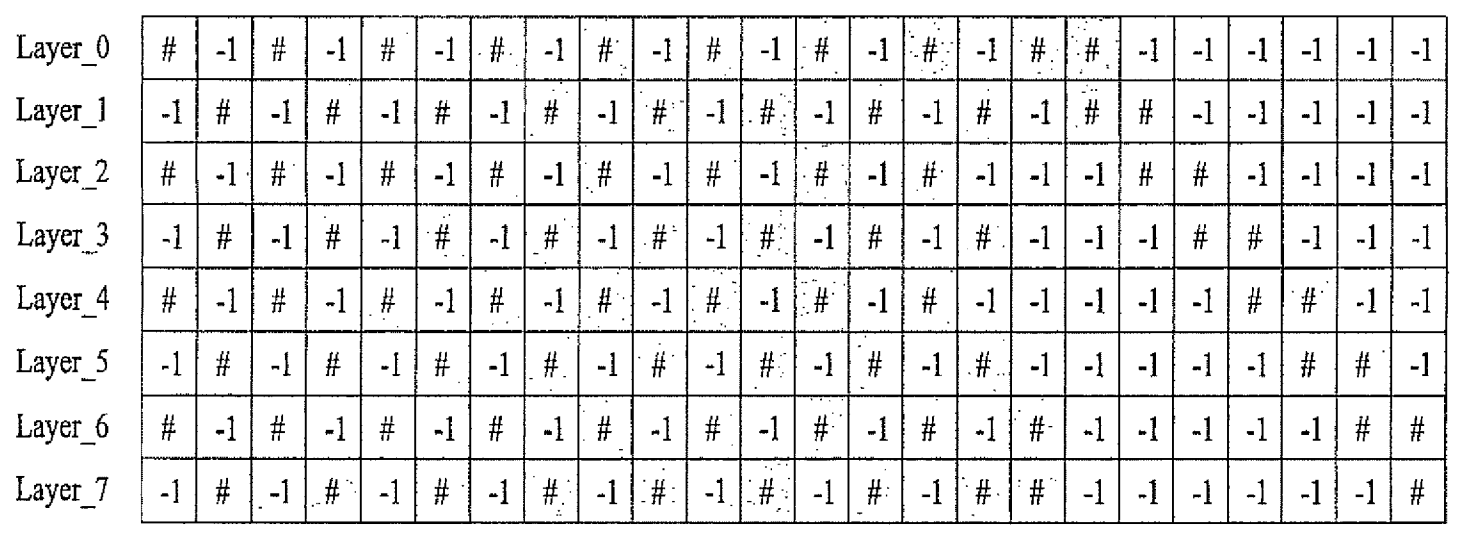
Figure 13C:
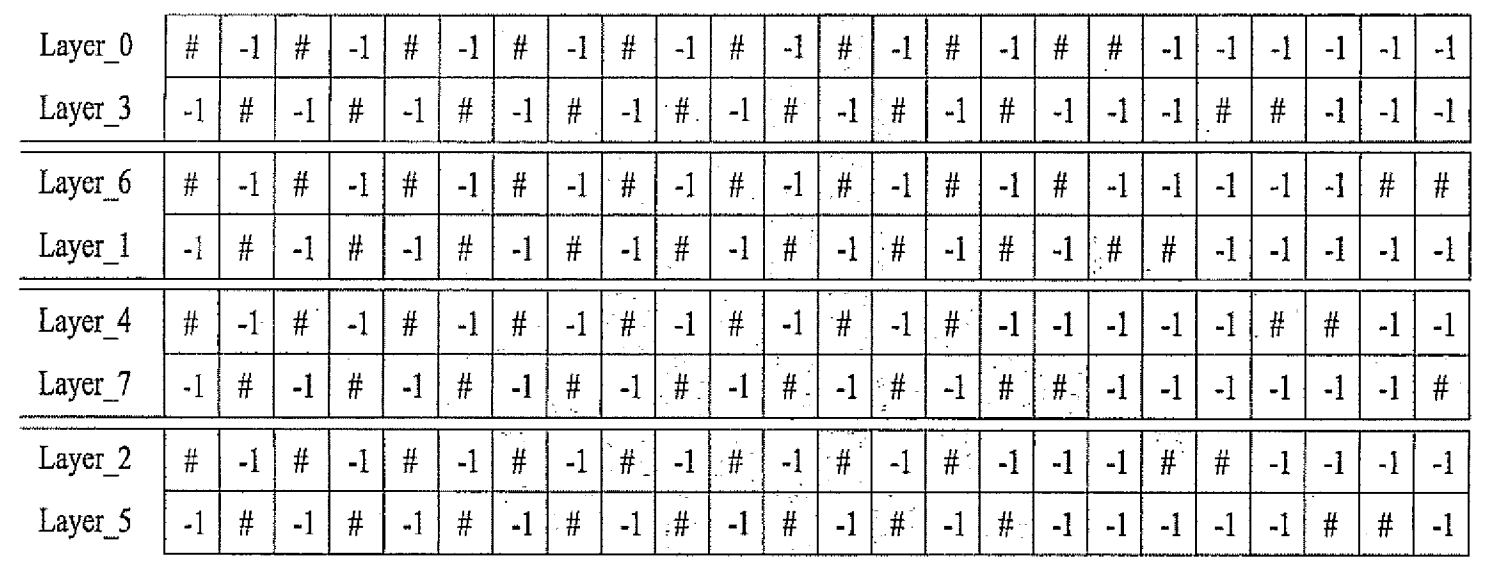
Figure 13D:
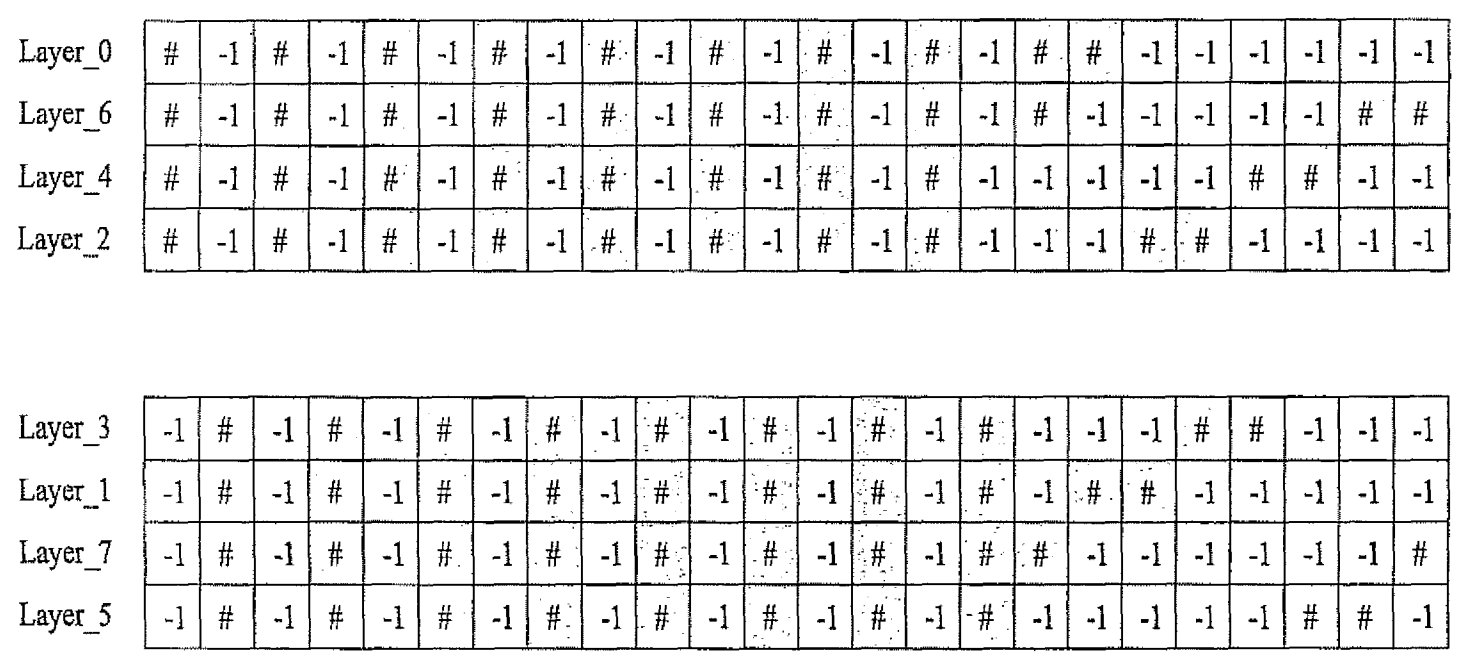

FIG. 13A illustrates an embodiment of a base matrix for the layered decoding according to an embodiment of the present invention. In this base matrix, "−1" denotes a zero matrix, and "#" denotes a permutation matrix formed by shifting each row or column of the base permutation matrix by the same number of rows or columns as an integer more than zero. In this embodiment, rows of a parity check matrix generated using the base matrix of FIG. 13A are grouped into layers, each layer including rows corresponding to the size of a base permutation matrix of the base matrix. Specifically, the number of rows included in each layer is equal to the number of rows of a base permutation matrix of the base matrix of FIG. 13A. Thus, a single layer of the parity check matrix generated using the base matrix corresponds to a single row of the base matrix. In the following, a description is given of how a new parity check matrix is designed by adjusting the row order of the base matrix so that positions in adjacent layers of the parity check matrix, where weights are present, do not overlap. Since there are dual diagonals in the base matrix, a parity check matrix according to the embodiment of the present invention can be designed by changing the order of rows of the base matrix without affecting the performance of LDPC decoding. FIG. 13B illustrates an example of a base matrix obtained by changing the row order of the base matrix of FIG. 13A so that elements having shift numbers greater than "0" of specific rows of the base matrix do not overlap in column direction, i.e., so that the column weights of the specific rows are equal to or lower than "1". In the example of FIG. 13B, positions in layer 0 and layer 3, where column weights are present, do not overlap in any column. FIG. 13C illustrates the base matrix of FIG. 13B that is divided into layer units to allow parallel processing. Two layers (for example, layer 0 and layer 3) can be processed at the same time when LDPC decoding is performed using a parity check matrix H generated using the base matrix shown in FIG. 13B or 13C. Specifically, as shown in FIG. 13D, the layers 0, 6, 4, and 2 can be processed in parallel (i.e., simultaneously) with the layers 3, 1, 7, and 5. Thus, performing the LDPC decoding using the parity check matrix according to the embodiment of the present invention has the same advantage as when two LDPC codes are decoded at a time through two processing units, and also reduces the decoding time by up to 50%.

FIG. 14 illustrates another embodiment of the base matrix when the code rate is ⅔. In this base matrix, "−1" denotes a zero matrix, and "integer" denotes a permutation matrix formed by shifting each row or column of the base permutation matrix by the same number of rows or columns as the integer that is equal to or greater than "0". "X" in the base matrix of FIG. 14 denotes an integer in the range of 0 to 95, which is preferably either 86, 89, or 95. Most preferably, the integer "X" is 95. The base matrix of FIG. 14 has a parallel processing feature and is suggested to achieve high performance. The parallel processing feature indicates that it is possible to apply the decoding method in which layered decoding is performed in a parallel processing fashion according to the present invention. In this embodiment, rows of a parity check matrix generated using the base matrix of FIG. 14 are grouped into layers, each layer including rows corresponding to the size of a base permutation matrix of the base matrix. Specifically, the number of rows included in each layer in the base matrix of FIG. 14 is equal to the number of rows of a base permutation matrix of the base matrix of FIG. 14. When the rows of the base matrix are identified by indices "1", "2", "3", "4", "5", "6", "7", and "8", a base matrix can be formed by permuting the rows so that elements having shift numbers greater than "0" of any two adjacent rows of the base matrix do not overlap. For example, as can be seen from FIG. 15, elements having shift numbers greater than "0" of the first row do not overlap in any column with those of the fourth row. A single row of the base matrix of FIG. 14 corresponds to a single layer of the parity check matrix H generated using the base matrix, and positions in the layers of the generated parity check matrix H, where weights are present, do not overlap in column direction.

FIG. 15 illustrates one of a number of examples of a base matrix that is created by permuting the rows of the base matrix of FIG. 14 to satisfy the requirements described above. The base matrix of FIG. 15 is an example where the order of the indices of the rows is changed to "1-4-7-2-5-8-3-6". In FIG. 15, the first row is additionally shown (i.e., "1-4-7-2-5-8-3-6-(l)") to make it easy to compare the first and last rows of the base matrix, the index order of which is "1-4-7-2-5-8-3-6".

All base matrices formed by permuting the rows of the base matrix shown in FIG. 15 define the same LDPC code as that defined by the base matrix of FIG. 14. Thus, even using the base matrix formed by permuting the rows, it is possible to perform decoding and encoding with the same performance as when using the base matrix of FIG. 8.

In the above description, higher performance indicates, for example, a better Frame Error Rate (FER). The decoding with the same performance indicates a decoding method that exhibits the same decoding performance, and the encoding with the same performance indicates generation of the same codeword.

Figure 16:
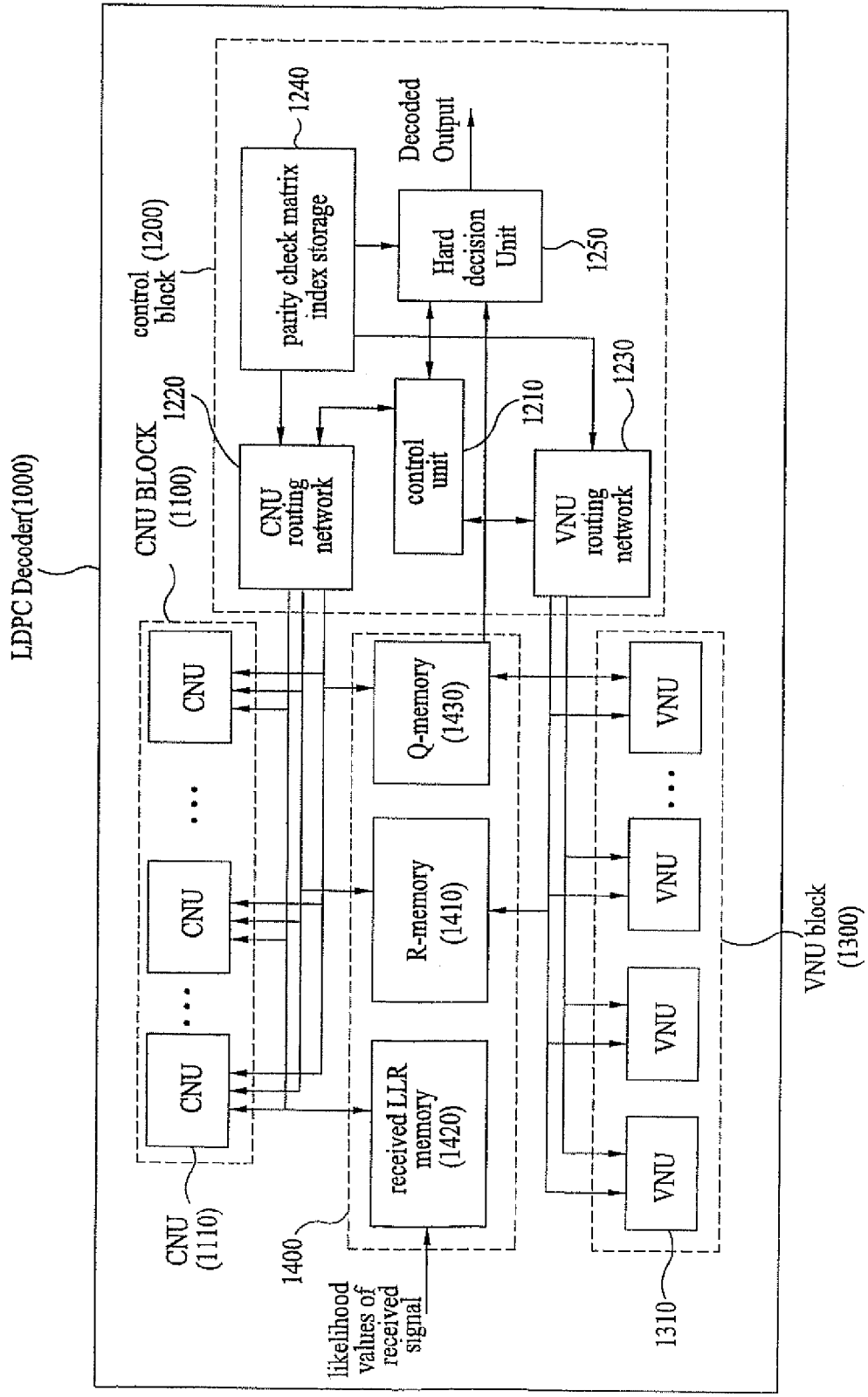
FIG. 16 is a block diagram illustrating an LDPC decoder according to an embodiment of the present invention.

A description will now be given of an LDPC decoder that performs LDPC decoding using a variety of base matrices suggested in the present invention. FIG. 16 is a block diagram illustrating an embodiment of an LDPC decoder according to the present invention. The LDPC decoder 1000 includes a Check Node update Unit (CNU) block 1100, a control block 1200, a Variable Node update Unit (VNU) block 1300, and a memory block 1400. The CNU block 1100 performs updating of the likelihood values of check nodes (i.e., performs check node update) and includes at least one CNU 1110. The CNU 1110 is a processing unit that performs check node update. The control block 1200 includes a control unit 1210, a CNU routing network 1220, a VNU routing network 1230, a parity check matrix index storage unit 1240, and a hard decision unit 1250. The control unit 1210 controls the operation of each unit of the decoder 1000. The CNU routing network 1220 controls the CNU block 1100 and the memory block 1400 according to the structure of the parity check matrix. The VNU routing network 1230 controls the VNU block 1100 and the memory block 1400. The parity check matrix index storage unit 1240 stores information regarding the structure of the parity check matrix H. The hard decision unit 1250 determines a decoded value using an updated likelihood value and checks the determined decoded value. The Variable Node update Unit (VNU) block 1300 performs updating of the likelihood values of variable nodes (i.e., performs variable node update) and includes at least one VNU 1310. The VNU 1310 is a processing unit that performs variable node update. The CNU 1110 and the VNU 1310 controlled by the control block 1200 calculate and update likelihood values of nonzero elements of the H matrix. The calculated likelihood values are stored in the memory block) 1400. The memory block 1400 includes an R-memory 1410, a received Log Likelihood Ratio (LLR) memory 1420, and a Q-memory 1430. The R-memory 1410 stores likelihood values calculated for check-to-variable node likelihood value update. The received LLR memory 1420 stores likelihood values (for example, LLR values received through a wireless channel) calculated for variable-to-check node likelihood value update. The Q-memory 1430 stores likelihood values calculated for variable-to-check node likelihood value update.

Each of the units is described below in more detail. The received LLR memory 1420 stores likelihood values of a received signal to be decoded, for example, LLR (Log Likelihood Ratio) values of a codeword of a received signal. The R-memory 1410 stores results "$R_{mj}$" of likelihood value update at a specific check node, and the Q-memory 1430 stores results "$L(q_{mj})$" of likelihood value update at a specific variable node. The control unit 1210 controls the order of operation of the units and the operation timing thereof. The parity check matrix index storage unit 1240 stores information regarding the positions of weights, etc., of the parity check matrix. The CNU routing network 1220 obtains information regarding the parity check matrix from the parity check matrix index storage unit 1240 and appropriately connects the CNU 1110 to the memories of the memory block 1400. The VNU routing network 1230 obtains information regarding the parity check matrix from the parity check matrix index storage unit 1240 and appropriately connects the VNU 1310 to the memories of the memory block 1400. The hard decision unit 1250 is a unit that determines a decoded value c' using the Q-memory 1430 and checks the determined decoded value c'. The hard decision unit 1250 outputs the decoded value c' as a true value if the decoded value c' satisfies a check equation "Hc'=0" and iterates the decoding up to a specific maximum number of times if the decoded value c' does not satisfy the check equation.

The decoder 1000 of FIG. 16 can decode a received signal using a parity check matrix stored in the parity check matrix index storage unit 1240 or a separate memory (not shown) or using a parity check matrix generated using a base matrix and a base permutation matrix. In the case of generating the parity check matrix using the base matrix and the base permutation matrix, the decoder 1000 preferably includes a storage unit (not shown) that stores the base matrix and the base permutation matrix and a parity check matrix generator (not shown) that generates the parity check matrix using the base matrix and the base permutation matrix. The decoder 1000 of FIG. 16 can generate a new parity check matrix by adjusting the order of rows (for example, the order of layers) of the parity check matrix. In this case, the decoder 1000 preferably includes a parity check matrix adjustor (not shown) that adjusts the order of rows of the parity check matrix.

A description will now be given of how the LDPC decoder 1000 operates. The LDPC decoder 1000 can perform decoding using a log Belief Propagation (BP) that is an LDPC decoding algorithm. The decoder 1000 operates according to an initialization step, a check node update step, a variable node update step, and a hard decision step. The initialization step includes the step of storing likelihood values of a received signal, which has been transmitted from a transmitting side, in the received LLR memory 1420 and then storing the likelihood values stored in the received LLR memory 1420 in the Q-memory 1430 at a specific position, using the information regarding weights of the parity check matrix stored in the parity check matrix index storage unit 1240. The check node update step includes the step of performing check node update (i.e., check-to-variable node update) using the likelihood values stored in the Q-memory 1430 and storing results of the check node update in the R-memory 1410. The variable node update step includes the step of performing variable node update (i.e., variable-to-check node update) using the likelihood values stored in the R-memory 1410 and storing results of the variable node update in the O-memory 1430. The hard decision step includes the step of temporarily determining a decoded value c' using the likelihood values stored in the Q-memory 1430, checking the determined decoded value c', outputting the decoded value c' if the decoded value c' is a true value, and iterating the check node update step and the variable node update step up to a specific maximum number of times if the decoded value c' is not a true value.

$$H = \begin{bmatrix} 1 & 1 & 1 & 0 & 1 & 0 & 0 & 0 \\ 0 & 1 & 1 & 1 & 0 & 1 & 0 & 0 \\ 1 & 0 & 1 & 1 & 0 & 0 & 1 & 0 \\ 1 & 1 & 0 & 1 & 0 & 0 & 0 & 1 \end{bmatrix} \quad \text{[Equation 3]}$$

If the parity check matrix H used in the decoder 1000 is equal to that of Equation 3, the R-memory 1410 and the Q-memory 1430 stores position values of nonzero elements (i.e., elements having "1") of the parity check matrix. Thus, the R-memory 1410 and the Q-memory 1430 store the position values as follows.

$$\begin{bmatrix} \# & \# & \# & - & \# & - & - & - \\ - & \# & \# & \# & - & \# & - & - \\ \# & - & \# & \# & - & - & \# & - \\ \# & \# & - & \# & - & - & - & \# \end{bmatrix}$$

Figure 17:
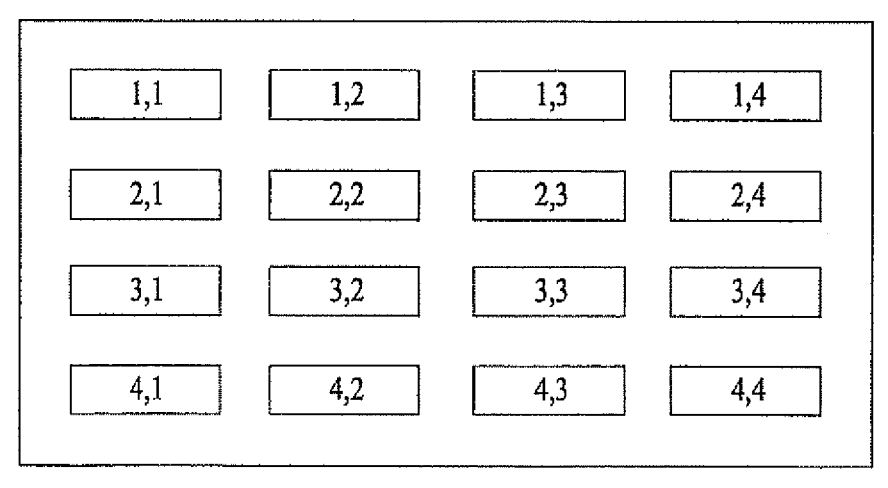

Since the R-memory 1410 and the Q-memory 1430 only need to store values corresponding to the positions of nonzero elements, they can store the results of processing for the likelihood value update in a structure as shown in FIG. 17. Thus, a memory size required for the LDPC decoding is proportional to the weights of the H matrix. Position information of the weights of the parity check matrix shown in FIG. 17 is stored in the parity check matrix index storage unit 1240. As described above, the decoder 1000 performs the decoding process using a parity check matrix H generated using a base matrix and a base permutation matrix, performs the decoding process using a parity check matrix stored in a specific memory, or performs the decoding process using a parity check matrix generated by any other method. The "parity check matrix" in the following description indicates an actual parity check matrix rather than a base matrix. There is no limitation on the method for generating the parity check matrix, and the parity check matrix may be generated using a base matrix and a base permutation matrix or may be generated by obtaining a parity check matrix stored in a specific memory or an external device.

Figure 18:
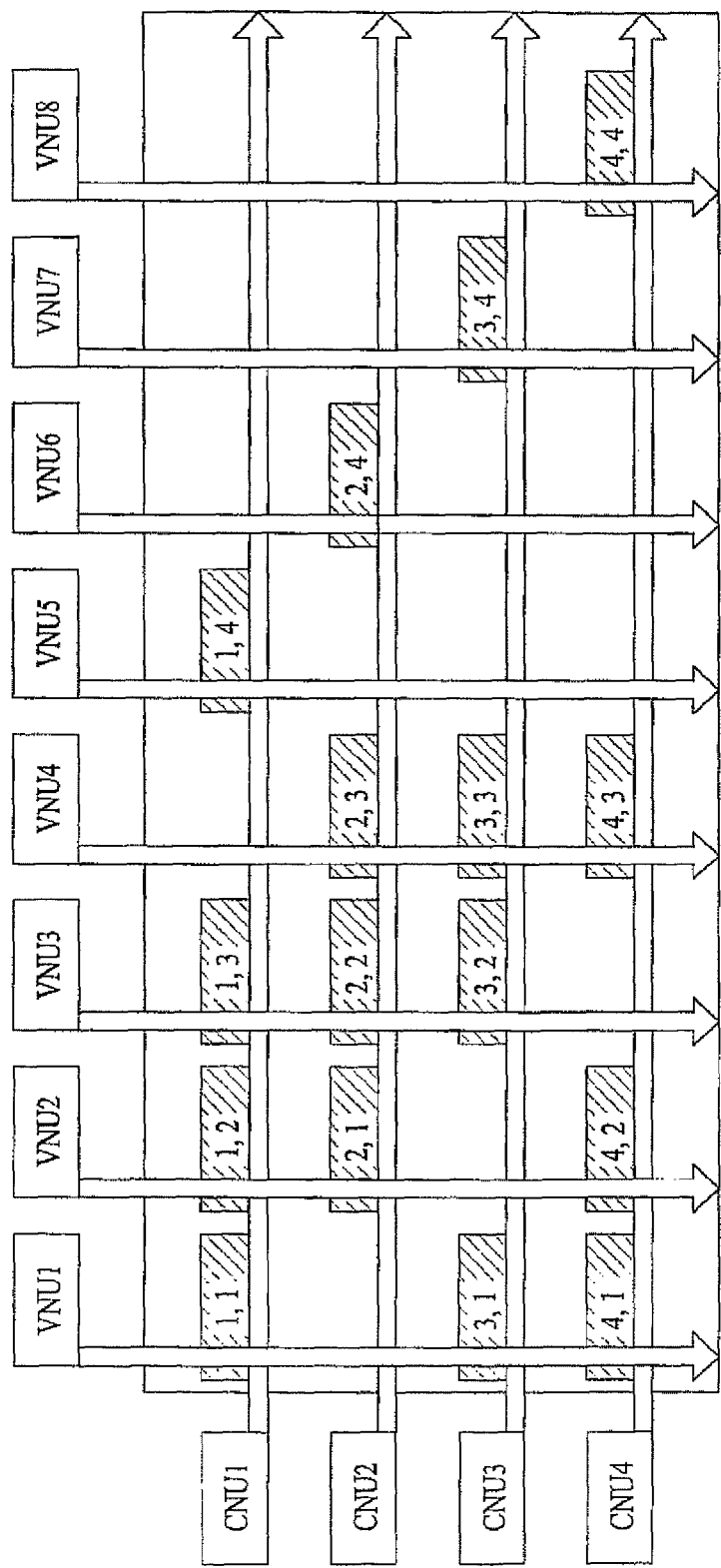
FIG. 18 illustrates an example of the connection between hardware elements of the LDPC decoder according to the embodiment of the present invention.

FIG. 18 illustrates an example of the connection between CNUs, VNUs, and memories of a decoder that performs decoding using the H matrix of Equation 3. In the example of FIG. 18, the decoder includes 4 CNUs and 8 VNUs. FIGS. 19A-19H illustrate one iteration of a decoding procedure, starting from an initialization step where likelihood values of a received signal are input, in the case where the decoding is performed using the decoder shown in FIG. 18. Coordinates shown in the R-memory 1410 and the Q-memory 1430 in FIGS. 19A-19H denote memory addresses when the memories have a format as shown in FIG. 17.

Figure 19A:
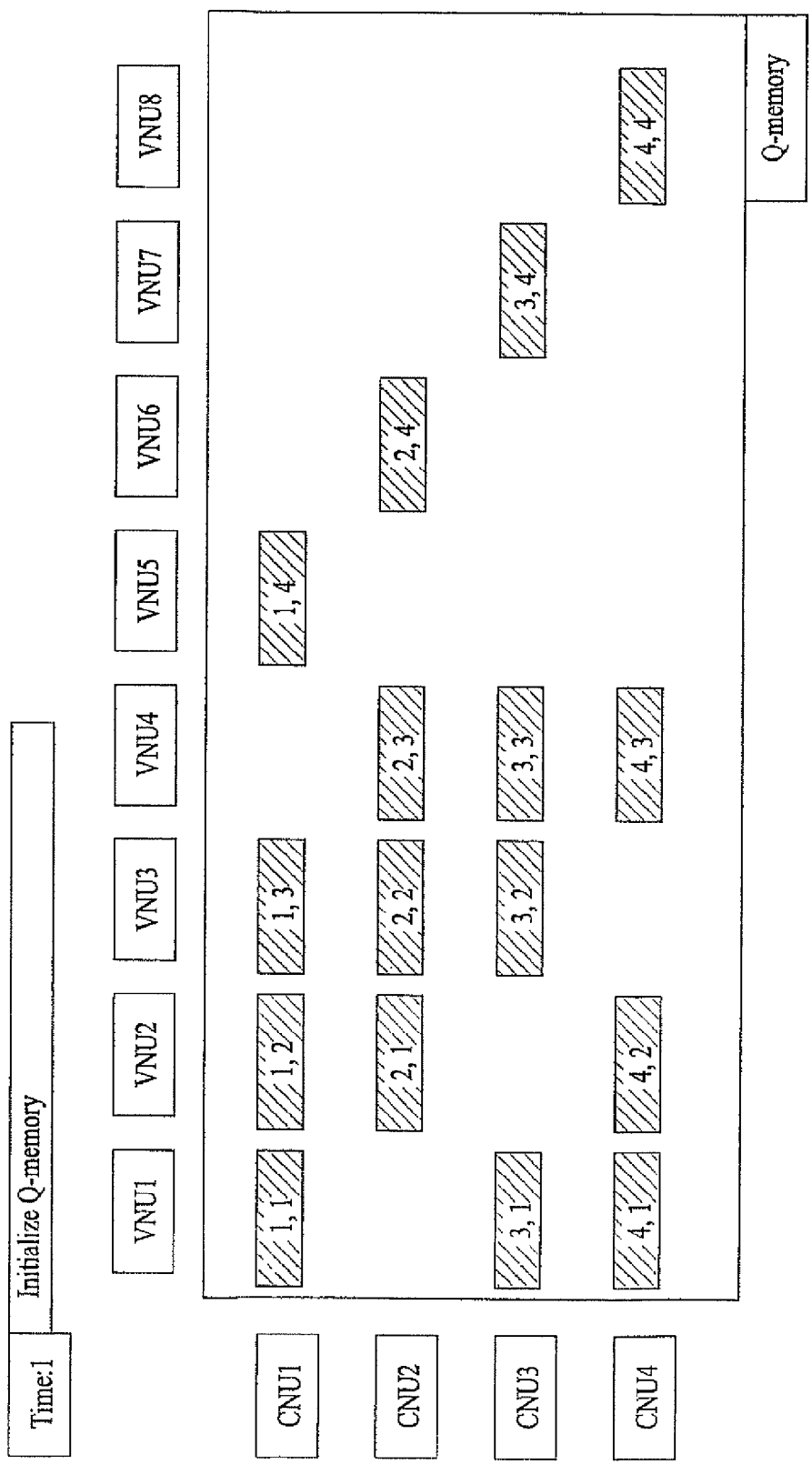
FIGS. 19A-19H illustrate one iteration of a decoding procedure, starting from an initialization step, when LDPC decoding is performed.
Figure 19B:
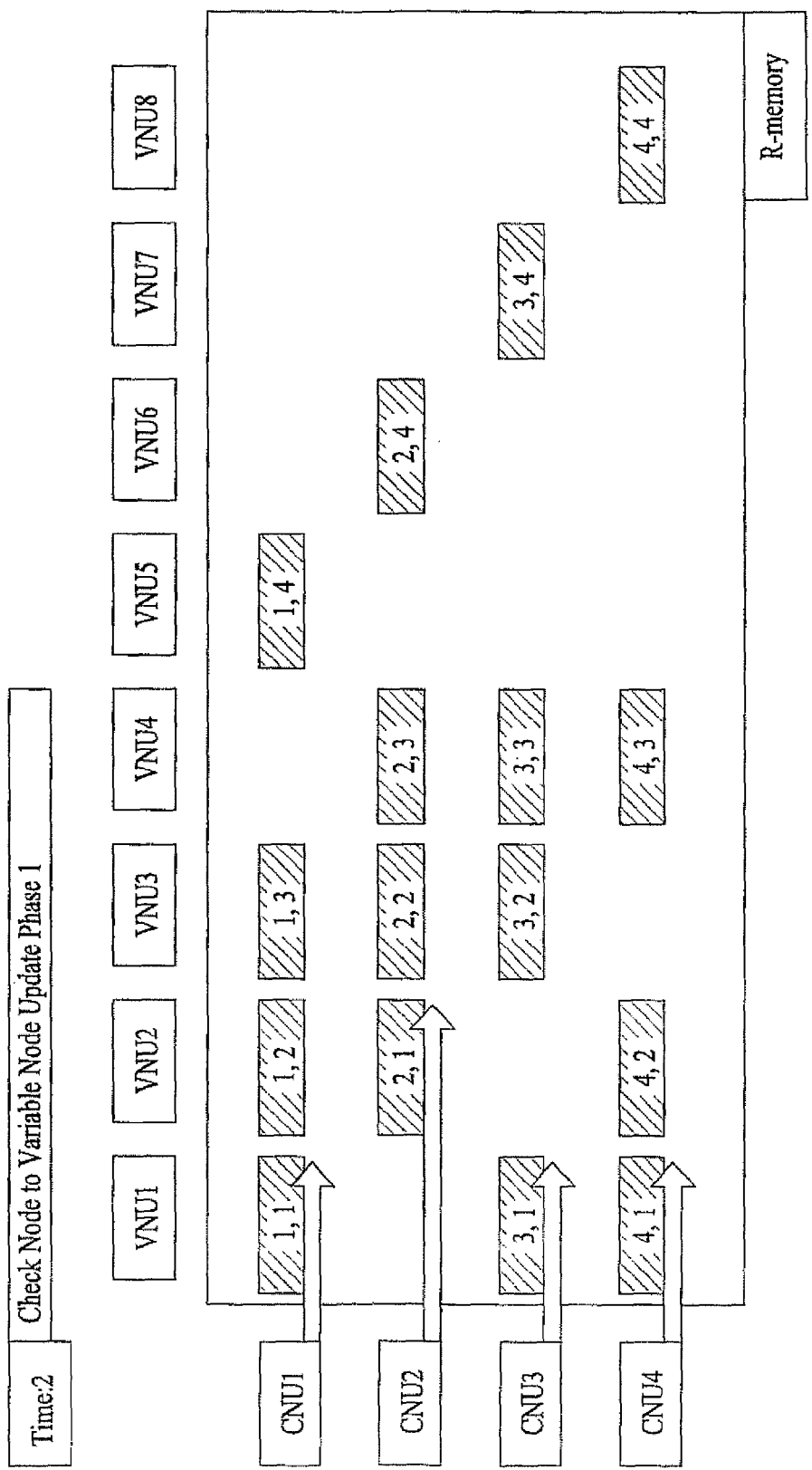

FIG. 19A illustrates the initialization step in the LDPC decoding. Elements shown in this figure denote nonzero elements in an H matrix, and likelihood values received from the transmitting side are input to memory addresses corresponding to the nonzero elements.

FIGS. 19B-19E illustrate the check-to-variable node likelihood value update. The check-to-variable node update at a specific position is a process of updating its element in a specific row using other elements in the specific row. FIGS. 19F-19H illustrate the variable-to-check node likelihood value update. The likelihood value update at a specific position is a process of updating its element in a specific column using other elements in the specific column.

Figure 19C:
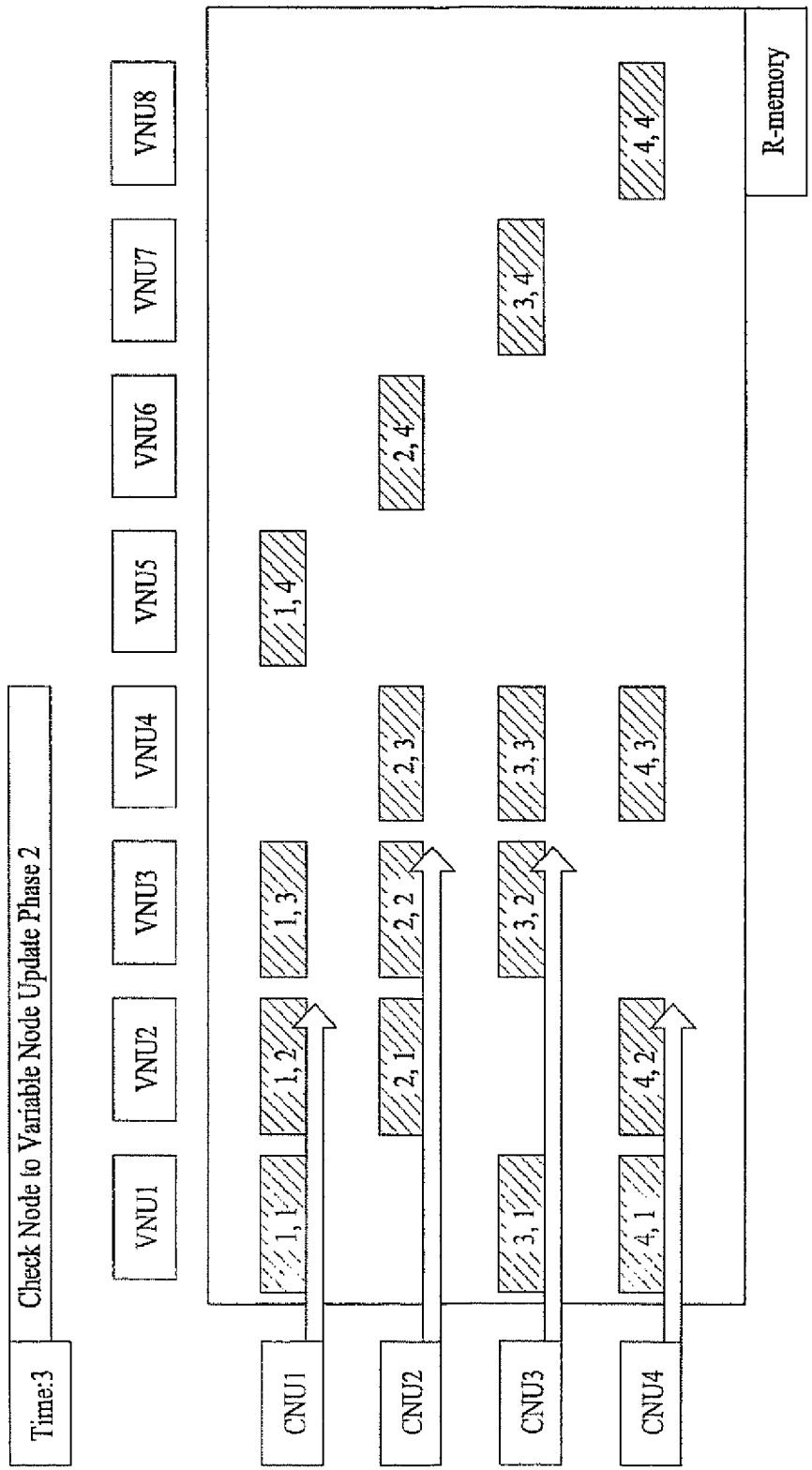
Figure 19D:
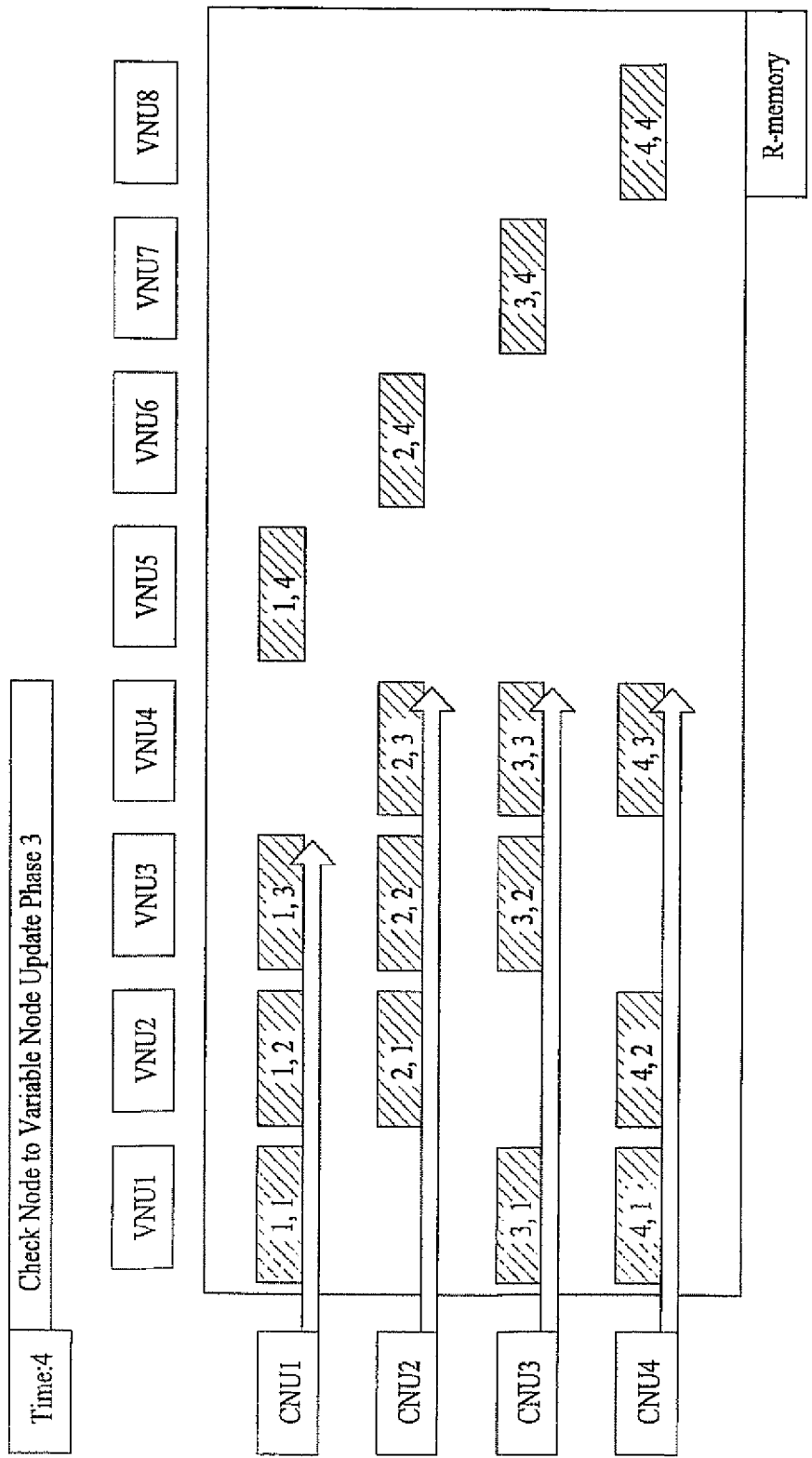
Figure 19E:
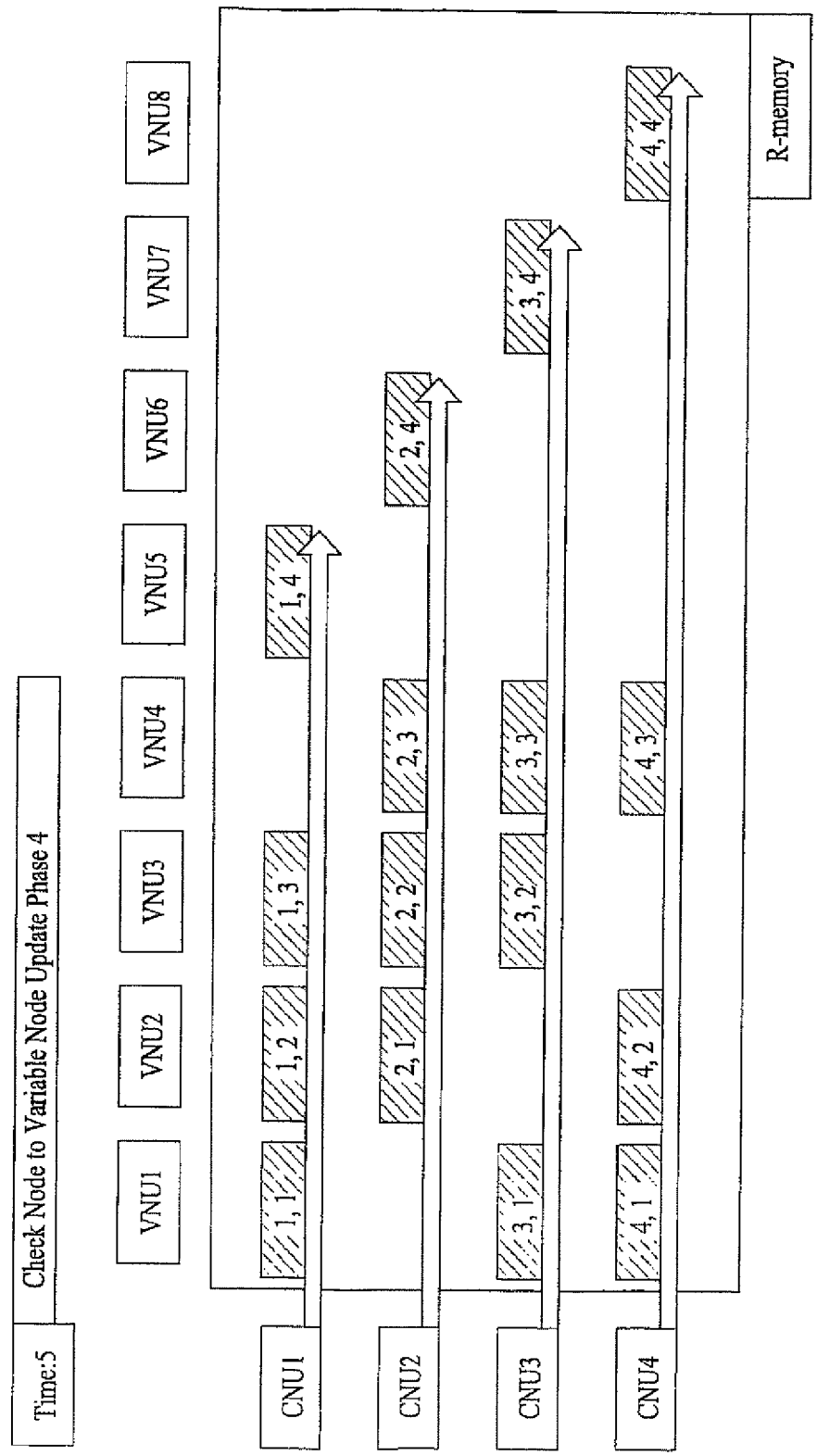
Figure 19F:
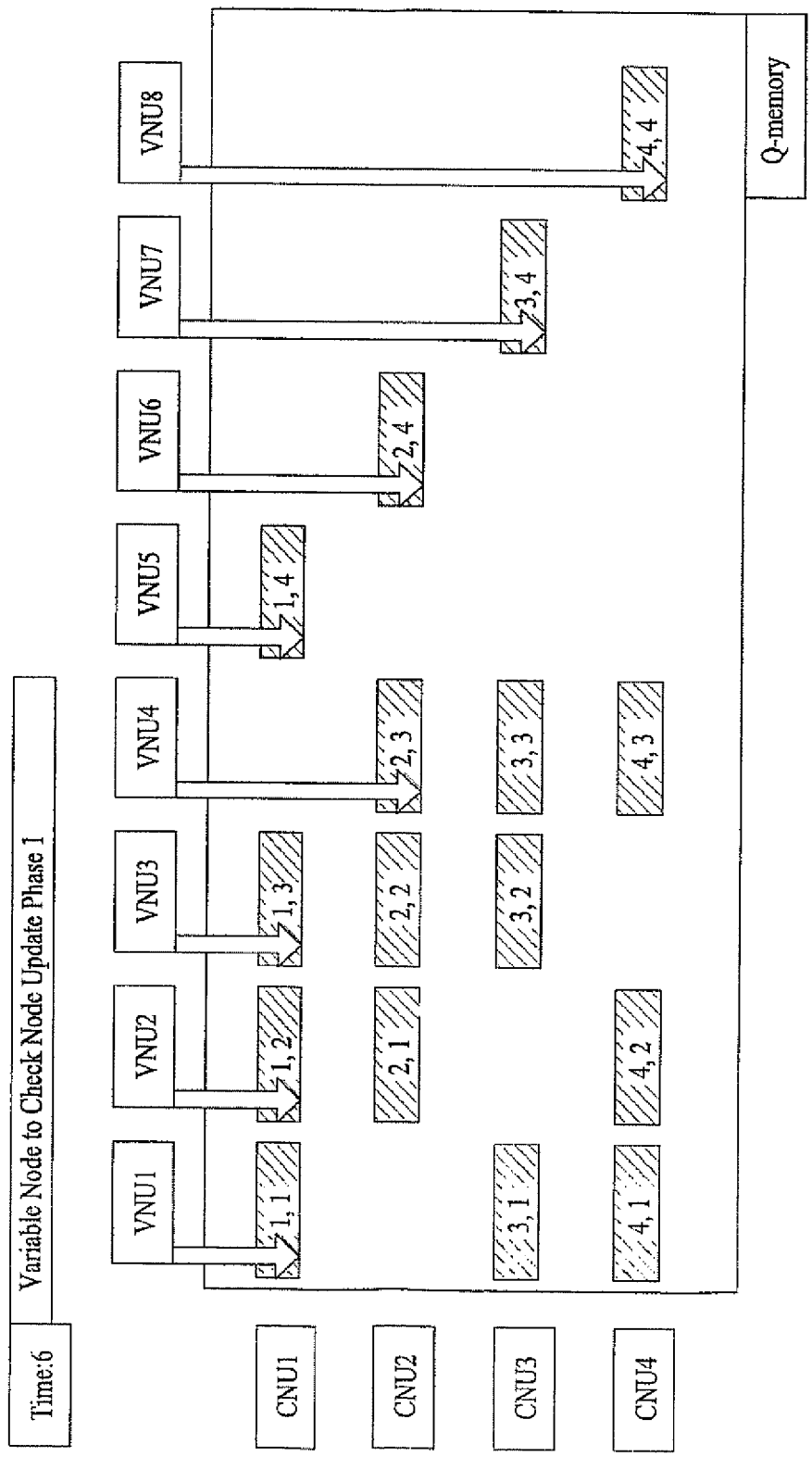
Figure 19G:
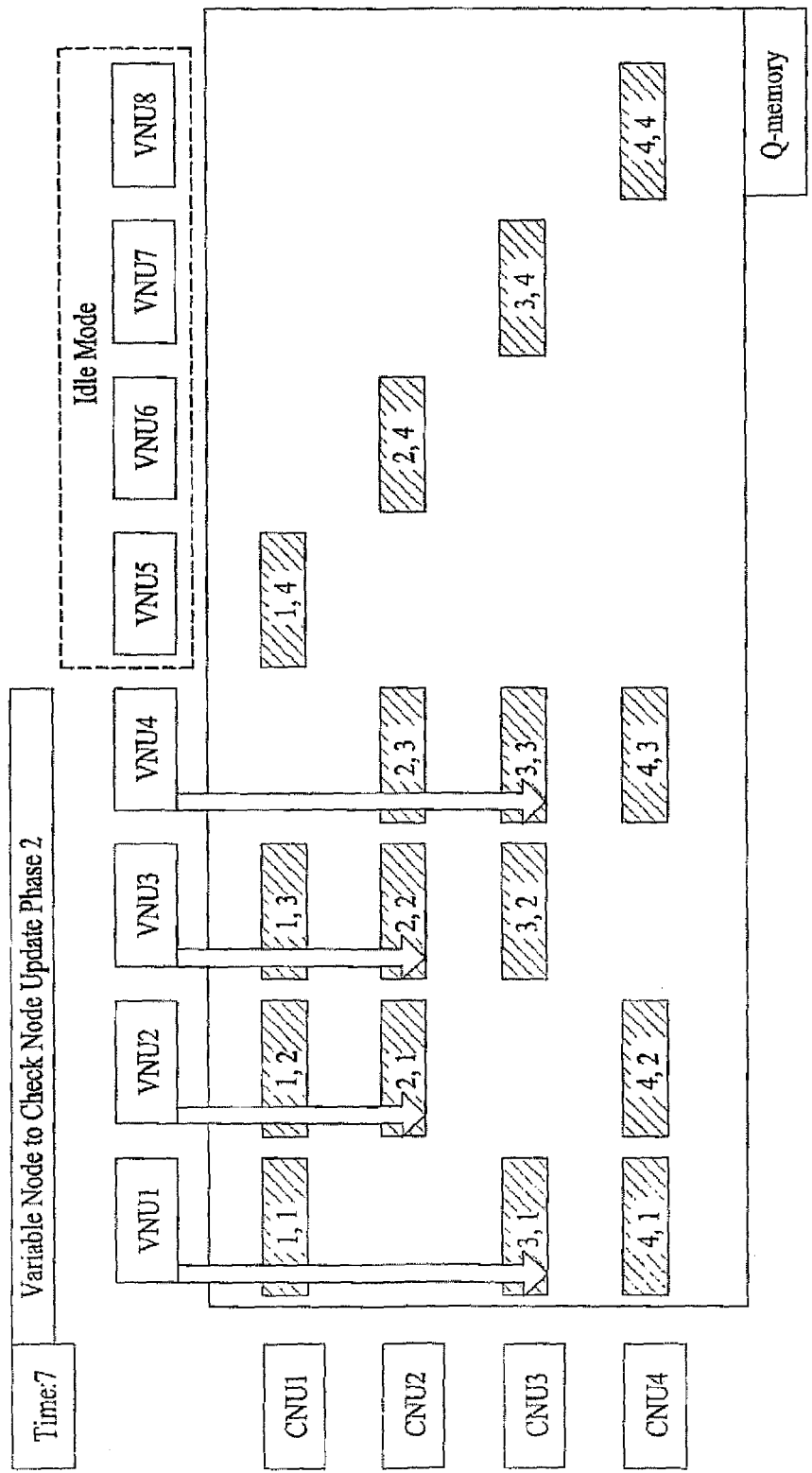
Figure 19H:
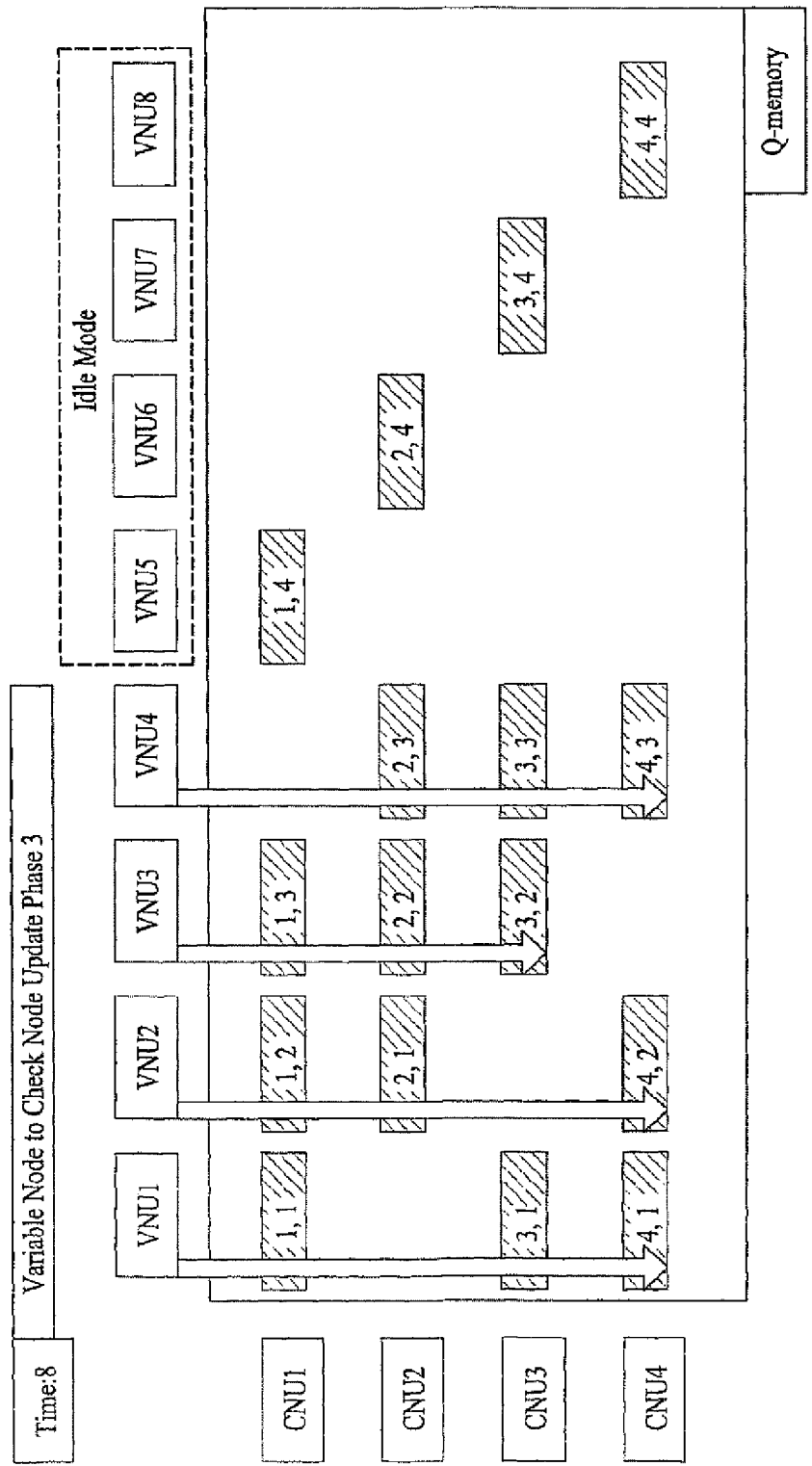

After the procedure up to the process of FIG. 19C is completed, a codeword is temporarily determined with reference to the Q-memory 1430 and it is determined whether or not the temporarily determined codeword c' satisfies a check equation "Hc'=0". If the temporarily determined codeword c' does not satisfy the check equation, the procedure of FIGS. 19B-19H is iterated. The procedure is terminated when the procedure has been iterated a predetermined number of times or when a codeword satisfying the check equation has been obtained.

A description will now be given of how the LDPC decoder 1000 operates to perform layered decoding in a parallel processing fashion.

According to an embodiment of the present invention, the CNU 1110 and the VNU 1310 of the LDPC decoder 1000 updates likelihood values through processing as expressed by Equation 4. Equation 4 is an equation that is used to perform one iteration of decoding.

For all $m$ in subset $k$ of the rows: [Equation 4]

$$L(q_{mj}) = L(q_j) - R_{mj}$$

$$A_{mj} \sum_{\substack{n \in N(m) \\ n \neq j}} \Psi(L(q_{mu}))$$

$$s_{mj} = \prod_{\substack{n \in N(m) \\ n \neq j}} \text{Sign}(L(q_{mn}))$$

$$R_{mj} = -s_{mj}\Psi(A_{mj})$$

$$L(q_j) = L(q_{mj}) + R_{mj}$$

The following are definition of variables used in Equation 4.

$$\Psi(x) \equiv \log\left(\left|\tanh\left(\frac{x}{2}\right)\right|\right)$$

$L(q_{mj})$: A Log Likelihood Ratio (LLR) value connected from an mth variable node to a jth check node.
$L(q_j)$: A posterior LLR value of a jth variable node.
$R_{mj}$: An LLR value connected from a jth check node to an mth variable node.
$A_{mj}$: A dummy variable for calculation of an LLR value connected from a jth check node to an mth variable node.

$S_{mj}$: A dummy variable for calculation of the signs of LLR values connected from a jth check node to an mth variable node.

m: check node index of parity check matrix.

j: variable node index of parity check matrix.

Equation 5 is an example of an LLR of a received signal, and Equation 6 is an example of a parity check matrix H used by the decoder 1000 according to an embodiment of the present invention.

$$LLR = [10.54\ 8.85\ 4.43\ 3.76\ 9.0\ 11.37\ 6.86\ 8.34\ 7.75\\ 4.43\ 8.99\ 8.02\ 5.21\ 10.45\ 5.3\ 7.03\ 6.54\ 9.67\ 9.08\\ 7.32\ 8.23\ 3.93\ 6.67\ 10.31]$$ [Equation 5]

$$\begin{array}{l}\text{Layer0}\\\text{Layer3}\\\text{Layer6}\\\text{Layer1}\\\text{Layer4}\\\text{Layer7}\\\text{Layer2}\\\text{Layer5}\end{array}\begin{bmatrix}1&0&1&0&1&0&1&0&1&0&1&0&1&0&1&1&0&0&0&0&0&0&0&0\\0&1&0&1&0&1&0&1&0&1&0&1&0&1&0&0&0&1&1&0&0&0&0&0\\1&0&1&0&1&0&1&0&1&0&1&0&1&0&1&0&0&0&0&0&1&1\\0&1&0&1&0&1&0&1&0&1&0&1&0&1&0&1&1&0&0&0&0&0\\1&0&1&0&1&0&1&0&1&0&1&0&1&0&0&0&0&0&1&1&0&0\\0&1&0&1&0&1&0&1&0&1&0&1&0&1&1&0&0&0&0&0&0&1\\1&0&1&0&1&0&1&0&1&0&1&0&1&0&0&0&1&1&0&0&0&0\\0&1&0&1&0&1&0&1&0&1&0&1&0&1&0&0&0&0&0&1&1&0\end{bmatrix}$$ [Equation 6]

The matrix of Equation 6 is an example of the parity check matrix H used by the decoder 1000 according to the embodiment of the present invention. A single row of the parity check matrix H represents a single layer. Each layer does not overlap adjacent layers. The respective numbers of the CNUs 1110 and the VNUs 1310 of the decoder 1000 are preferably determined based on the structure of the parity check matrix. Layers that do not overlap are processed in parallel. Thus, the number of the CNUs 1110 is more preferably equal to the number of rows included in each of the layers that are processed in parallel, and the number of the VNUs 1310 is more preferably equal to the number of columns of the parity check matrix. Accordingly, the number of the CNUs 1110 of the decoder 1000 that uses Equation 6 is preferably 2 and the number of the VNUs 1310 is preferably 24.

FIGS. 20A-20I illustrate one iteration of a decoding procedure when decoding is performed according to an LDPC decoding method of the present invention. In FIGS. 20A-20I, "Q" and "R" denote the states of the memories in which $q_{mj}$ and $R_{mj}$ values of Equation 4 are stored, and "###" denotes an arbitrary value that has not yet been set to a specific value. The Q-memory 1430 and the R-memory 1410 in FIGS. 20A-20I can store only processed values that correspond to the positions of nonzero elements as the format shown in FIG. 17.

FIG. 20A illustrates an initialization step in LDPC decoding according to an embodiment of the present invention. A likelihood value (for example, an LLR value) received through a channel is stored in the received LLR memory 1420, and the received likelihood value is input to the Q-memory 1430 according to the position information of the weights of the parity check matrix H stored in the parity check matrix index storage unit 1240. FIG. 20A shows a likelihood value input to the Q memory through the initialization step.

FIG. 20B illustrates a check-to-variable node likelihood value update procedure for layer 0 and layer 3 of the H matrix. The CNUs 1110 perform processing for check-to-variable node likelihood value update for the layer 0 and the layer 3 of the H matrix. As described above, the number of the CNUs 1110 is 2, and the two CNUs 1110 perform a check node update procedure for the layers 0 and 3. The processing results are stored in the R-memory 1410.

FIG. 20C illustrates a variable-to-check node likelihood value update procedure for layer 0 and layer 3 of the H matrix. In the variable-to-check node likelihood value update procedure, likelihood values of a current layer are updated using likelihood values of a layer that has already been updated in the procedure of the same iteration, which is different from the conventional LDPC decoding procedure. Since the layer 0 and the layer 3 do not overlap, they have no problems such as memory collisions due to parallel processing or dependency between data processed in parallel. Thus, a variable-to-check node likelihood value update process for the layer 0 and a variable-to-check node likelihood value update process for the layer 3 can be processed in parallel. As described above, the decoder performs processing for the layer 0 and the layer 3 using 24 VNUs 1310. FIG. 20C shows the result of variable-to-check node likelihood value update for the layer 0 and the layer 3. Moreover, FIG. 20C shows the result of a setting step at which likelihood values for check-to-variable node likelihood value update for layer 6 and layer 1 are input.

FIG. 20D illustrates a check-to-variable node likelihood value update procedure for the layer 6 and the layer 1 of the H matrix, FIG. 20E illustrates a variable-to-check node likelihood value update procedure for the layer 6 and the layer 1 of the H matrix, FIG. 20F illustrates a check-to-variable node likelihood value update procedure for layer 4 and layer 7 of the H matrix, FIG. 20G illustrates a variable-to-check node likelihood value update procedure for the layer 4 and the layer 7 of the H matrix, FIG. 20H illustrates a check-to-variable node likelihood value update procedure for layer 2 and layer 5 of the H matrix, and FIG. 20I illustrates a variable-to-check node likelihood value update procedure for the layer 2 and the layer 5 of the H matrix. The values stored in the Q-memory 1430 are the processed values that have been obtained through one iteration. After the procedure up to the process of FIG. 20I is completed, the hard decision unit 1250 temporarily determines a codeword c' with reference to the Q-memory 1430 and determines whether or not the temporarily determined codeword c' satisfies a check equation "Hc'=0". If the temporarily determined codeword c' does not satisfy the check equation, the decoder iterates the procedure of FIGS. 20B-20I. If the procedure has been iterated a maximum number of times or if a codeword satisfying the check equation has been obtained, the procedure is terminated and the codeword c' is output.

The decoding method shown in FIGS. 20A-20I has the following difference from the decoding method shown in FIGS. 19A-19I. In the decoding method of FIGS. 19A-19I, one check node update procedure and one variable node update procedure are performed using a maximum number of CNUs and VNUs according to the size of the parity check matrix H. On the other hand, in the decoding method of FIGS. 20A-20I, the same number of CNUs as the number of layers having no data dependency (i.e., the number of layers that do not overlap in the parity check matrix) are provided, and the check node update procedure can be performed in parallel processing fashion according to the number of layers having no data dependency.

In the decoding method shown in FIGS. 19A-19I, the entire area of the Q-memory 1430 is initialized using likelihood values of a received signal. On the other hand, in the decoding method shown in FIGS. 20A-20I, layers that can be processed in parallel are initialized and resulting values of the layers are used as initial values of next layers.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

INDUSTRIAL APPLICABILITY

The present invention can be applied to communication systems that require encoding and decoding. The present invention can also be applied to various other devices that require encoding and decoding.

The present invention provides an encoding and decoding method using LDPC codes that can improve data encoding or decoding performance at a transmitting or receiving side.

What is claimed is:

1. A decoding method using channel codes, the method comprising:
   receiving a signal encoded using a parity check matrix H generated from a base matrix $H_b$; and
   decoding the received signal using the base matrix $H_b$, a z-by-z base permutation matrix and a z-by-z zero matrix, wherein z is greater than 1,
   wherein the base matrix $H_b$ is represented as $$\begin{bmatrix} 2 & -1 & 19 & -1 & 47 & -1 & 48 & -1 & 36 & -1 & 82 & -1 \\ -1 & 69 & -1 & 88 & -1 & 33 & -1 & 3 & -1 & 16 & -1 & 37 \\ 10 & -1 & 86 & -1 & 62 & -1 & 28 & -1 & 85 & -1 & 16 & -1 \\ -1 & 28 & -1 & 32 & -1 & 81 & -1 & 27 & -1 & 88 & -1 & 5 \\ 23 & -1 & 29 & -1 & 15 & -1 & 30 & -1 & 66 & -1 & 24 & -1 \\ -1 & 30 & -1 & 65 & -1 & 54 & -1 & 14 & -1 & 0 & -1 & 30 \\ 32 & -1 & 0 & -1 & 15 & -1 & 56 & -1 & 85 & -1 & 5 & -1 \\ -1 & 0 & -1 & 47 & -1 & 13 & -1 & 61 & -1 & 84 & -1 & 55 \end{bmatrix}$$

-continued $$\begin{bmatrix} 47 & -1 & 15 & -1 & | & X & 0 & -1 & -1 & -1 & -1 & -1 & -1 \\ -1 & 40 & -1 & 48 & | & -1 & 0 & 0 & -1 & -1 & -1 & -1 & -1 \\ 34 & -1 & 73 & -1 & | & -1 & -1 & 0 & 0 & -1 & -1 & -1 & -1 \\ -1 & 56 & -1 & 37 & | & -1 & -1 & -1 & 0 & 0 & -1 & -1 & -1 \\ 50 & -1 & 62 & -1 & | & -1 & -1 & -1 & -1 & 0 & 0 & -1 & -1 \\ -1 & 74 & -1 & 0 & | & -1 & -1 & -1 & -1 & -1 & 0 & 0 & -1 \\ 6 & -1 & 52 & -1 & | & 0 & -1 & -1 & -1 & -1 & -1 & 0 & 0 \\ -1 & 78 & -1 & 41 & | & X & -1 & -1 & -1 & -1 & -1 & -1 & 0 \end{bmatrix},$$

wherein "−1" denotes the z-by-z zero matrix, a non-negative integer denotes a shift number by which each row or each column of the z-by-z base permutation matrix is shifted to generate a z-by-z permutation matrix, and "X" denotes an integer in a range from 0 to 95, and wherein a pair of rows of the base matrix $H_b$ is processed in parallel for decoding the received signal, wherein at most one non-zero matrix element denoting a z-by-z matrix other than the z-by-z zero matrix is present in the pair of rows in a column direction.

2. The method of claim 1, further comprising:
checking whether the decoded signal is correct.

3. The method of claim 1, wherein, if rows of the base matrix $H_b$ are labeled by indices 1, 2, 3, 4, 5, 6, 7 and 8 as follows $$\begin{bmatrix} [1] \\ [2] \\ [3] \\ [4] \\ [5] \\ [6] \\ [7] \\ [8] \end{bmatrix} \begin{bmatrix} 2 & -1 & 19 & -1 & 47 & -1 & 48 & -1 & 36 & -1 & 82 & -1 & 47 & -1 & 15 & -1 & | & X & 0 & -1 & -1 & -1 & -1 & -1 & -1 \\ -1 & 69 & -1 & 88 & -1 & 33 & -1 & 3 & -1 & 16 & -1 & 37 & -1 & 40 & -1 & 48 & | & -1 & 0 & 0 & -1 & -1 & -1 & -1 & -1 \\ 10 & -1 & 86 & -1 & 62 & -1 & 28 & -1 & 85 & -1 & 16 & -1 & 34 & -1 & 73 & -1 & | & -1 & -1 & 0 & 0 & -1 & -1 & -1 & -1 \\ -1 & 28 & -1 & 32 & -1 & 81 & -1 & 27 & -1 & 88 & -1 & 5 & -1 & 56 & -1 & 37 & | & -1 & -1 & -1 & 0 & 0 & -1 & -1 & -1 \\ 23 & -1 & 29 & -1 & 15 & -1 & 30 & -1 & 66 & -1 & 24 & -1 & 50 & -1 & 62 & -1 & | & -1 & -1 & -1 & -1 & 0 & 0 & -1 & -1 \\ -1 & 30 & -1 & 65 & -1 & 54 & -1 & 14 & -1 & 0 & -1 & 30 & -1 & 74 & -1 & 0 & | & -1 & -1 & -1 & -1 & -1 & 0 & 0 & -1 \\ 32 & -1 & 0 & -1 & 15 & -1 & 56 & -1 & 85 & -1 & 5 & -1 & 6 & -1 & 52 & -1 & | & 0 & -1 & -1 & -1 & -1 & -1 & 0 & 0 \\ -1 & 0 & -1 & 47 & -1 & 13 & -1 & 61 & -1 & 84 & -1 & 55 & -1 & 78 & -1 & 41 & | & X & -1 & -1 & -1 & -1 & -1 & -1 & 0 \end{bmatrix},$$

the decoding of the received signal comprises:

inputting data corresponding to the received signal to two rows of the base matrix $H_b$, the two rows being the rows of the base matrix $H_b$ labeled by the indices 1 and 4, the rows of the base matrix $H_b$ labeled by the indices 7 and 2, the rows of the base matrix $H_b$ labeled by the indices 5 and 8, or the rows of the base matrix $H_b$ labeled by the indices 3 and 6; and updating the data input to the two rows of the base matrix $H_b$, wherein updating the input data comprises:

performing a check-to-variable node data update for the two rows of the base matrix $H_b$; and performing a variable-to-check node data update for the two rows of the base matrix $H_b$.

4. The method of claim 3, wherein the input data is data that has been updated.

5. The method of claim 1, wherein decoding the received signal comprises:

adjusting an order of the rows of the base matrix $H_b$ such that at most one z-by-z permutation matrix is present in a column direction of two adjacent rows of the adjusted base matrix $H_b$ as follows:

$$\begin{bmatrix} [1] \\ [4] \\ [7] \\ [2] \\ [5] \\ [8] \\ [3] \\ [6] \end{bmatrix} \begin{bmatrix} 2 & -1 & 19 & -1 & 47 & -1 & 48 & -1 & 36 & -1 & 82 & -1 & 47 & -1 & 15 & -1 & | & X & 0 & -1 & -1 & -1 & -1 & -1 & -1 \\ -1 & 28 & -1 & 32 & -1 & 81 & -1 & 27 & -1 & 88 & -1 & 5 & -1 & 56 & -1 & 37 & | & -1 & -1 & -1 & 0 & 0 & -1 & -1 & -1 \\ 32 & -1 & 0 & -1 & 15 & -1 & 56 & -1 & 85 & -1 & 5 & -1 & 6 & -1 & 52 & -1 & | & 0 & -1 & -1 & -1 & -1 & -1 & 0 & 0 \\ -1 & 69 & -1 & 88 & -1 & 33 & -1 & 3 & -1 & 16 & -1 & 37 & -1 & 40 & -1 & 48 & | & -1 & 0 & 0 & -1 & -1 & -1 & -1 & -1 \\ 23 & -1 & 29 & -1 & 15 & -1 & 30 & -1 & 66 & -1 & 24 & -1 & 50 & -1 & 62 & -1 & | & -1 & -1 & -1 & -1 & 0 & 0 & -1 & -1 \\ -1 & 0 & -1 & 47 & -1 & 13 & -1 & 61 & -1 & 84 & -1 & 55 & -1 & 78 & -1 & 41 & | & X & -1 & -1 & -1 & -1 & -1 & -1 & 0 \\ 10 & -1 & 86 & -1 & 62 & -1 & 28 & -1 & 85 & -1 & 16 & -1 & 34 & -1 & 73 & -1 & | & -1 & -1 & 0 & 0 & -1 & -1 & -1 & -1 \\ -1 & 30 & -1 & 65 & -1 & 54 & -1 & 14 & -1 & 0 & -1 & 30 & -1 & 74 & -1 & 0 & | & -1 & -1 & -1 & -1 & -1 & 0 & 0 & -1 \end{bmatrix},$$

wherein processing the rows of the base matrix $H_b$ labeled by the indices 1 and 4 in parallel comprises processing adjacent rows of the adjusted base matrix $H_b$ labeled by the indices 1 and 4 in parallel;

wherein processing the rows of the base matrix $H_b$ labeled by the indices 7 and 2 in parallel comprises processing adjacent rows of the adjusted base matrix $H_b$ labeled by the indices 7 and 2 in parallel;

wherein processing the rows of the base matrix $H_b$ labeled by the indices 5 and 8 in parallel comprises processing adjacent rows of the adjusted base matrix $H_b$ labeled by the indices 5 and 8 in parallel; and wherein processing the rows of the base matrix $H_b$ labeled by the indices 3 and 6 in parallel comprises processing adjacent rows of the adjusted base matrix $H_b$ labeled by the indices 3 and 6 in parallel.

6. The method of claim 1, wherein the z-by-z base permutation matrix is a z-by-z identity matrix.

7. The method of claim 1, wherein decoding the received signal comprises:

generating the parity check matrix H from the base matrix $H_b$ by replacing each "−1" of the base matrix $H_b$ with the z-by-z zero matrix and replacing each non-negative integer of the base matrix $H_b$ with a z-by-z permutation matrix corresponding to the non-negative integer; and decoding the received signal using the parity check matrix H.

8. A decoding apparatus using channel codes, the apparatus comprising:

a receiver module for receiving a signal encoded using a parity check matrix H generated from a base matrix $H_b$;

a memory for storing the base matrix $H_b$; and a decoding module for decoding the received signal using the base matrix $H_b$, a z-by-z base permutation matrix and a z-by-z zero matrix, wherein z is greater than 1, wherein the base matrix $H_b$ is represented as $$\begin{bmatrix} 2 & -1 & 19 & -1 & 47 & -1 & 48 & -1 & 36 & -1 & 82 & -1 \\ -1 & 69 & -1 & 88 & -1 & 33 & -1 & 3 & -1 & 16 & -1 & 37 \\ 10 & -1 & 86 & -1 & 62 & -1 & 28 & -1 & 85 & -1 & 16 & -1 \\ -1 & 28 & -1 & 32 & -1 & 81 & -1 & 27 & -1 & 88 & -1 & 5 \\ 23 & -1 & 29 & -1 & 15 & -1 & 30 & -1 & 66 & -1 & 24 & -1 \\ -1 & 30 & -1 & 65 & -1 & 54 & -1 & 14 & -1 & 0 & -1 & 30 \\ 32 & -1 & 0 & -1 & 15 & -1 & 56 & -1 & 85 & -1 & 5 & -1 \\ -1 & 0 & -1 & 47 & -1 & 13 & -1 & 61 & -1 & 84 & -1 & 55 \end{bmatrix}$$

-continued $$\begin{bmatrix} 47 & -1 & 15 & -1 & | & X & 0 & -1 & -1 & -1 & -1 & -1 \\ -1 & 40 & -1 & 48 & | & -1 & 0 & 0 & -1 & -1 & -1 & -1 & -1 \\ 34 & -1 & 73 & -1 & | & -1 & -1 & 0 & 0 & -1 & -1 & -1 & -1 \\ -1 & 56 & -1 & 37 & | & -1 & -1 & -1 & 0 & 0 & -1 & -1 & -1 \\ 50 & -1 & 62 & -1 & | & -1 & -1 & -1 & -1 & 0 & 0 & -1 & -1 \\ -1 & 74 & -1 & 0 & | & -1 & -1 & -1 & -1 & -1 & 0 & 0 & -1 \\ 6 & -1 & 52 & -1 & | & 0 & -1 & -1 & -1 & -1 & -1 & 0 & 0 \\ -1 & 78 & -1 & 41 & | & X & -1 & -1 & -1 & -1 & -1 & -1 & 0 \end{bmatrix},$$

wherein "−1" denotes the z-by-z zero matrix, a non-negative integer denotes a shift number by which each row or each column of the z-by-z base permutation matrix is shifted to generate a z-by-z permutation matrix, and "X" denotes an integer in a range from 0 to 95, and wherein the decoding module decodes the received signal by processing a pair of rows of the base matrix $H_b$ in parallel, wherein at most one non-zero matrix element denoting a z-by-z matrix other than the z-by-z zero matrix is present in the pair of rows in a column direction.

9. The apparatus of claim 8, wherein the decoding module includes a checking module for checking whether the decoded signal is correct.

10. The apparatus of claim 8, wherein the decoding module includes:

a plurality of check node update units for updating data input to two rows of the base matrix $H_b$, the two rows being the rows of the base matrix $H_b$ labeled by the indices 1 and 4, the rows of the base matrix $H_b$ labeled by the indices 7 and 2, the rows of the base matrix $H_b$ labeled by the indices 5 and 8, or the rows of the base matrix $H_b$ labeled by the indices 3 and 6, and for performing a check-to-variable node update of the data input to the two rows of the base matrix $H_b$; and a plurality of variable node update units for performing a variable-to-check node update of the data input to the two rows of the base matrix $H_b$.

11. The apparatus of claim 10, wherein the input data is data that has already been updated by the plurality of check node update units or the plurality of variable node update units.

12. The apparatus of claim 8, wherein the decoding module is further for:

adjusting an order of the layers of the base matrix $H_b$ such that at most one z-by-z permutation matrix is present in a column direction of two adjacent layers of the adjusted base matrix $H_b$ as follows:

$$\begin{matrix}[1]\\[4]\\[7]\\[2]\\[5]\\[8]\\[3]\\[6]\end{matrix}\begin{bmatrix} 2 & -1 & 19 & -1 & 47 & -1 & 48 & -1 & 36 & -1 & 82 & -1 & 47 & -1 & 15 & -1 & X & 0 & -1 & -1 & -1 & -1 & -1 & -1 \\ -1 & 28 & -1 & 32 & -1 & 81 & -1 & 27 & -1 & 88 & -1 & 5 & -1 & 56 & -1 & 37 & -1 & -1 & -1 & 0 & 0 & -1 & -1 & -1 \\ 32 & -1 & 0 & -1 & 15 & -1 & 56 & -1 & 85 & -1 & 5 & -1 & 6 & -1 & 52 & -1 & 0 & -1 & -1 & -1 & -1 & -1 & 0 & 0 \\ -1 & 69 & -1 & 88 & -1 & 33 & -1 & 3 & -1 & 16 & -1 & 37 & -1 & 40 & -1 & 48 & -1 & 0 & 0 & -1 & -1 & -1 & -1 & -1 \\ 23 & -1 & 29 & -1 & 15 & -1 & 30 & -1 & 66 & -1 & 24 & -1 & 50 & -1 & 62 & -1 & -1 & -1 & -1 & -1 & 0 & 0 & -1 & -1 \\ -1 & 0 & -1 & 47 & -1 & 13 & -1 & 61 & -1 & 84 & -1 & 55 & -1 & 78 & -1 & 41 & X & -1 & -1 & -1 & -1 & -1 & -1 & 0 \\ 10 & -1 & 86 & -1 & 62 & -1 & 28 & -1 & 85 & -1 & 16 & -1 & 34 & -1 & 73 & -1 & -1 & -1 & 0 & 0 & -1 & -1 & -1 & -1 \\ -1 & 30 & -1 & 65 & -1 & 54 & -1 & 14 & -1 & 0 & -1 & 30 & -1 & 74 & -1 & 0 & -1 & -1 & -1 & -1 & -1 & 0 & 0 & -1 \end{bmatrix};$$

processing the rows of the base matrix $H_b$ labeled by the indices 1 and 4 in parallel by processing adjacent rows of the adjusted base matrix $H_b$ labeled by the indices 1 and 4 in parallel;

processing the rows of the base matrix $H_b$ labeled by the indices 7 and 2 in parallel by processing adjacent rows of the adjusted base matrix $H_b$ labeled by the indices 7 and 2 in parallel;

processing the rows of the base matrix $H_b$ labeled by the indices 5 and 8 in parallel by processing adjacent rows of the adjusted base matrix $H_b$ labeled by the indices 5 and 8 in parallel; and processing the rows of the base matrix $H_b$ labeled by the indices 3 and 6 in parallel by processing adjacent rows of the adjusted base matrix $H_b$ labeled by the indices 3 and 6 in parallel.

13. The apparatus of claim 8, wherein the z-by-z base permutation matrix is a z-by-z identity matrix.

14. The apparatus of claim 8, wherein the decoding module is further for:

generating the parity check matrix H from the base matrix $H_b$ by replacing each "−1" of the base matrix $H_b$ with the z-by-z zero matrix and replacing each non-negative integer of the base matrix $H_b$ with a z-by-z permutation matrix corresponding to the non-negative integer; and decoding the received signal using the parity check matrix H.

\* \* \* \* \*